(12) United States Patent
Na

(10) Patent No.: US 12,274,097 B2
(45) Date of Patent: Apr. 8, 2025

(54) PHOTO-DETECTING APPARATUS

(71) Applicant: Artilux, Inc., Menlo Park, CA (US)

(72) Inventor: Yun-Chung Na, San Jose, CA (US)

(73) Assignee: Artilux, Inc., Menlo Park, CA (US)

( * ) Notice: Subject to any disclaimer, the term of this patent is extended or adjusted under 35 U.S.C. 154(b) by 514 days.

(21) Appl. No.: 17/692,679

(22) Filed: Mar. 11, 2022

(65) Prior Publication Data

US 2022/0302188 A1 Sep. 22, 2022

Related U.S. Application Data

(60) Provisional application No. 63/163,057, filed on Mar. 19, 2021.

(51) Int. Cl.
*H10F 39/00* (2025.01)
*H04N 25/705* (2023.01)

(52) U.S. Cl.
CPC ......... *H10F 39/802* (2025.01); *H04N 25/705* (2023.01); *H10F 39/8037* (2025.01); *H10F 39/806* (2025.01)

(58) Field of Classification Search
CPC ......... H01L 27/14603; H01L 27/14612; H01L 27/14625; H04N 25/705
See application file for complete search history.

(56) References Cited

U.S. PATENT DOCUMENTS

| | | | |
|---|---|---|---|
| 2018/0247968 A1* | 8/2018 | Na | H01L 29/161 |
| 2019/0267498 A1* | 8/2019 | Cheng | H01L 31/1075 |
| 2019/0312158 A1* | 10/2019 | Chen | H01L 27/1443 |
| 2020/0395393 A1 | 12/2020 | Cheng et al. | |
| 2021/0066529 A1 | 3/2021 | Lu et al. | |

FOREIGN PATENT DOCUMENTS

EP 3607738 2/2020

OTHER PUBLICATIONS

EP Extended Search Report in European Appln. No. 22162997.5, dated Aug. 23, 2022, 8 pages.

* cited by examiner

*Primary Examiner* — Thanh Luu
(74) *Attorney, Agent, or Firm* — Fish & Richardson P.C.

(57) ABSTRACT

Methods, devices, apparatus, and systems for photo-detecting are provided. The photo-detecting apparatus includes a substrate, an absorption region supported by the substrate and configured to receive an optical signal and generate photo-carriers in response to the optical signal, and multiple sets of a switch including a first set and a second set. The substrate includes a first material, and the absorption region includes a second material. The absorption region is arranged in between the first set and the second set. Each of the multiple sets includes a respective control region and a respective readout region. The respective control regions of the multiple sets of the switch are configured to receive a control signal, and the respective readout regions of the multiple sets of the switch are configured to provide one or more electrical signals representing first collective information for deriving time-of-flight information associated with the optical signal.

16 Claims, 28 Drawing Sheets

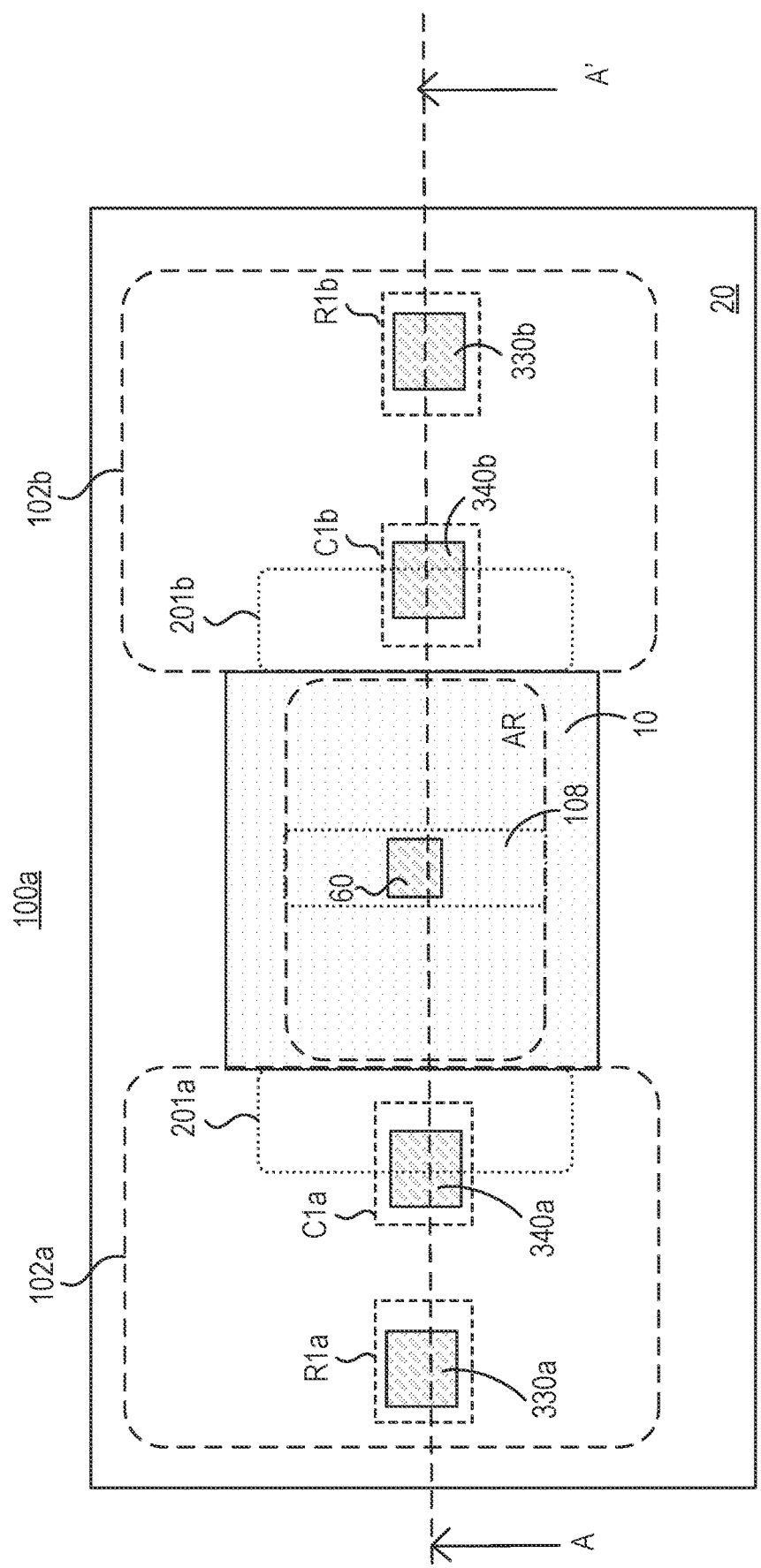

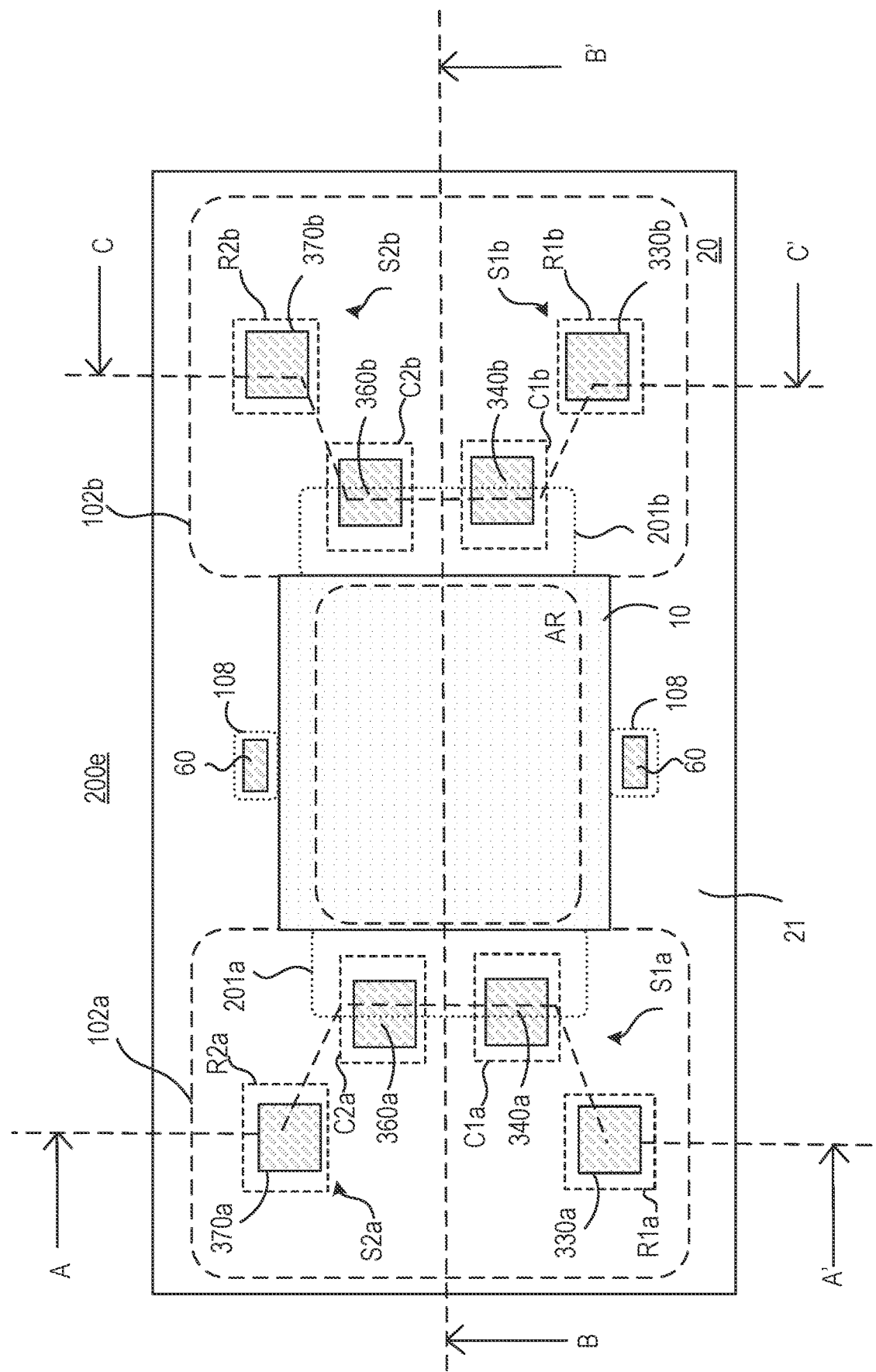

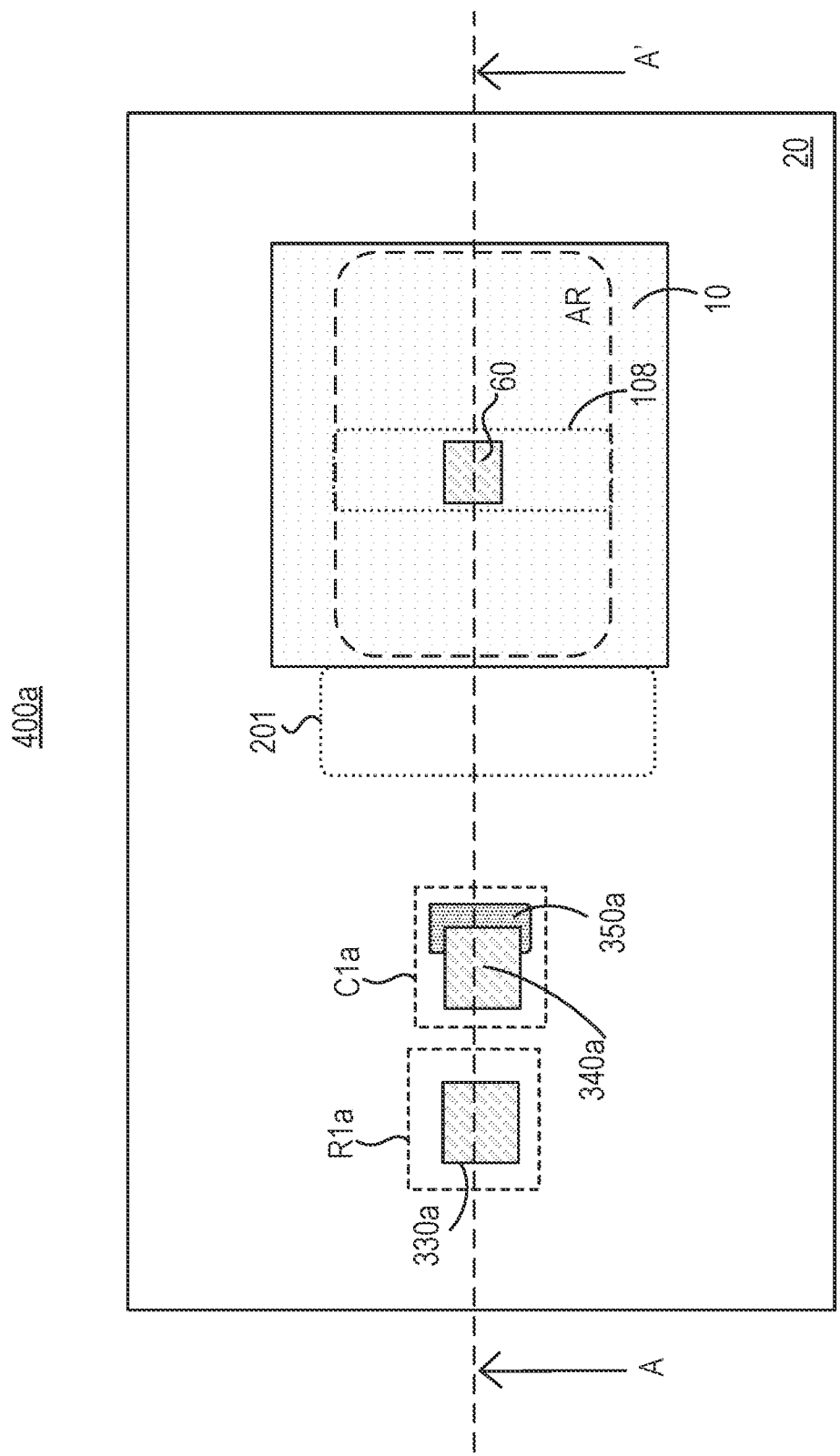

PHOTO-DETECTING APPARATUS

CROSS-REFERENCE TO RELATED APPLICATION

This application claims priority under 35 USC § 119(e) to U.S. Provisional Patent Application Ser. No. 63/163,057, entitled "PHOTO-DETECTING APPARATUS" and filed on Mar. 19, 2021, the entire content of which is hereby incorporated by reference.

BACKGROUND

Photodetectors may be used to detect optical signals and convert the optical signals to electrical signals that may be further processed by another circuitry. Photodetectors may be used in consumer electronics products, proximity sensing, biometric sensing, image sensors, high-speed optical receiver, data communications, direct/indirect time-of-flight (TOF) ranging or imaging sensors, medical devices, and many other suitable applications.

SUMMARY

The present disclosure describes systems, devices, apparatus, methods, and techniques for photo detecting.

One aspect of the present disclosure features a photo-detecting apparatus, including: a substrate including a first material; an absorption region including a second material, where the absorption region is supported by the substrate, and where the absorption region is configured to receive an optical signal and to generate photo-carriers in response to the optical signal; and multiple readout electrodes electrically to a same readout circuit. The absorption region is arranged in between at least two of the multiple readout electrodes.

Another aspect of the present disclosure features a photo-detecting apparatus, including: a substrate including a first material; an absorption region including a second material, where the absorption region is supported by the substrate, and where the absorption region is configured to receive an optical signal and to generate photo-carriers in response to the optical signal; and multiple sets of a switch including a first set and a second set. The absorption region is arranged in between the first set and the second set. Each of the multiple sets includes a respective control region and a respective readout region. The respective control regions of the multiple sets of the switch are configured to receive a same control signal, and the respective readout regions of the multiple sets of the switch are configured to provide one or more electrical signals representing first collective information for deriving time-of-flight information associated with the optical signal.

In some embodiments, the photo-detecting apparatus further includes one or more carrier-guiding regions formed at least partially in the substrate and in contact with the absorption region, and each of the one or more carrier-guiding regions is electrically coupled to a respective set of the multiple sets of the switch. Each of the one or more carrier-guiding regions can be n-doped.

In some embodiments, the absorption region is doped with a graded doping profile. The absorption region can include a first surface and a second surface between the first surface of the absorption region and a surface of the substrate, and the graded doping profile of the absorption region can be gradually decreased along a direction from the second surface of the absorption region to the first surface of the absorption region.

In some embodiments, the absorption region further includes a plurality of carrier-output regions each in contact with a respective carrier-guiding region of the one or more of carrier-guiding regions.

In some embodiments, the absorption region is of a first conductivity type, the one or more of carrier-guiding regions are of a second conductivity type different from the first conductivity type, the substrate is of the first conductivity type, each of the respective control regions includes a carrier control region of the first conductivity type, each of the respective readout regions includes a carrier-collection region of the second conductivity type, and the one or more carrier-guiding regions are separated from the carrier control regions and the carrier-collection regions. The substrate can further include a counter doped region at least partially overlapped with one of the carrier control regions, and the counter doped region can be of the second conductivity type.

Another aspect of the present disclosure features a photo-detecting apparatus, including: a substrate including a first surface and a second surface opposite to the first surface; an absorption region supported by the substrate and configured to receive an optical signal and to generate photo-carriers in response to the optical signal; and N sets of switches electrically coupled to the absorption region, where each set of the switches includes a respective first switch and a respective second switch, where each of the first switches and the second switches includes a respective control electrode and a respective readout electrode over the first surface, and where N≥2. The absorption region is arranged in between two sets of the N sets of switches. The first switches of the N sets of switches are configured to be controlled by a first control signal to collectively operate as a first single switch. The second switches of the N sets of switches are configured to be controlled by a second control signal different from the first control signal to collectively operate as a second single switch.

In some embodiments, the photo-detecting apparatus further includes one or N carrier-guiding regions formed at least partially in the substrate and in contact with the absorption region, and each of the one or N carrier-guiding regions is electrically coupled to a respective set of the N sets of switches.

In some embodiments, the absorption region is of a first conductivity type, and each of the one or N carrier-guiding regions is of a second conductivity type different from the first conductivity type. In some embodiments, the absorption region is doped with a graded doping profile. The absorption region can include a first surface and a second surface between the first surface of the absorption region and the second surface of the substrate, and the graded doping profile of the absorption region can be gradually decreased along a direction from the second surface of the absorption region to the first surface of the absorption region. The absorption region can further include a plurality of carrier-output regions in contact with a respective carrier-guiding region.

Each of the one or N carrier-guiding regions can be n-doped. The substrate can include a material different from a material of the absorption region. The absorption region can include M sides, and the N sets of switches can be each disposed at a corresponding one of the M sides of the absorption region respectively, where M≥N.

In some embodiments, the absorption region is of a first conductivity type, the one or N carrier-guiding regions are of a second conductivity type different from the first conductivity type, and the substrate is of the first conductivity type. Each of the first switches and the second switches can include a carrier control region of the first conductivity type and a carrier-collection region of the second conductivity type. In some embodiments, the carrier control region is under the respective control electrode, the carrier-collection region is under the respective readout electrode, and the one or N carrier-guiding regions are separated from the carrier control regions and the carrier-collection regions.

In some embodiments, the substrate further includes counter doped regions each at least partially overlapped with a respective carrier control region, where the counter doped regions are of the second conductivity type. The counter doped regions can be separated from the one or N carrier-guiding regions.

In some embodiments, a depth of the one or N carrier-guiding regions is less than a depth of the absorption region. In some embodiments, the absorption region is between the one or N carrier-guiding regions.

In some embodiments, the respective readout electrodes of the multiple switches are configured to provide one or more electrical signals representing first collective information for deriving time-of-flight information associated with the optical signal.

Another aspect of the present disclosure features a photo-detecting apparatus, including: a substrate having a first surface and a second surface opposite to the first surface; an absorption region supported by the substrate and configured to receive an optical signal and to generate photo-carriers in response to the optical signal, where the absorption region and the substrate are of a first conductivity type; one of more carrier-guiding regions formed at least partially in the substrate and in contact with the absorption region, where the one or more carrier-guiding regions are of a second conductivity type different from the first conductivity type; and one or more sets of switches electrically coupled to the absorption region, where each set of the one or more sets of switches includes a first switch and a second switch. Each of the first switches and the second switches includes a respective control electrode and a respective readout electrode over the first surface. Each of the first switches and the second switches includes a respective carrier-collection region under the respective readout electrode and a respective carrier control region under the respective control electrode, and the one or more carrier-guiding regions are separated from the respective carrier-collection region and the respective carrier control region.

In some embodiments, the substrate further includes counter doped regions each at least partially overlapped with a corresponding carrier control region, and the counter doped regions are of the second conductivity type. The counter doped regions can be separated from the one or more carrier-guiding regions.

In some embodiments, a depth of the one or more carrier-guiding regions is less than a depth of the absorption region.

In some embodiments, the absorption region is doped with a graded doping profile. The absorption region includes a first surface and a second surface between the first surface of the absorption region and the second surface of the substrate, and the graded doping profile of the absorption region can be gradually decreased along a direction from the second surface of the absorption region to the first surface of the absorption region. The absorption region can further include a plurality of carrier-output regions each in contact with a respective carrier-guiding region of the one or more carrier-guiding regions.

In some embodiments, the substrate includes a material different from a material of the absorption region. In some embodiments, the respective readout electrodes of the multiple switches are configured to provide one or more electrical signals representing first collective information for deriving time-of-flight information associated with the optical signal.

Another aspect of the present disclosure features a photo-detecting apparatus, including: a substrate including a first surface and a second surface opposite to the first surface; an absorption region supported by the substrate and configured to receive an optical signal and to generate one or more photo-carriers in response to the optical signal, where the absorption region is of a first conductivity type; a first contact region electrically coupled to the absorption region; and N sets of gain components each including: multiple second contact regions each having the first conductivity type and formed in the substrate, and multiple third contact regions each having a second conductivity type different from the first conductivity type and formed in the substrate. At least two sets of the N sets of gain components are disposed at two opposite sides of the absorption region respectively. The multiple second contact regions are configured to be applied to a first voltage, and the multiple third contact regions are configured to be applied to a second voltage.

In some embodiments, the photo-detecting apparatus further includes: multiple multiplication regions formed between a respective second contact region and a respective third contact region and capable of generating one or more additional charge carriers in response to receiving the one or more photo-carriers generated from the absorption region. At least two of the multiple multiplication regions can be formed at two opposite sides of the absorption region.

In some embodiments, the absorption region is doped with a graded doping profile. The absorption region includes a first surface and a second surface between the first surface of the absorption region and the second surface of the substrate, and the graded doping profile of the absorption region can be gradually decreased along a direction from the second surface of the absorption region to the first surface of the absorption region.

In some embodiments, the photo-detecting apparatus further includes one or more carrier-guiding regions at least formed in the substrate and in contact with the absorption region, and each of the one or more carrier-guiding regions is electrically coupled to the respective set of the N sets of gain components.

In some embodiments, the absorption region further includes one or more carrier-output regions each in contact with a respective carrier-guiding region of the one or more carrier-guiding regions, and the one or more carrier-output regions are doped with a lowest doping concentration in the absorption region.

In some embodiments, the substrate includes a material different from a material of the absorption region. In some embodiments, the third contact regions are configured to provide one or more electrical signals representing first collective information for deriving time-of-flight information associated with the optical signal.

Another aspect of the present disclosure features a photo-detecting apparatus, including: a substrate having a first surface and a second surface opposite to the first surface; an absorption region supported by the substrate and configured to receive an optical signal and to generate photo-carriers in response to the optical signal, where the absorption region and the substrate are of a first conductivity type; one or more carrier-guiding regions formed at least partially in the substrate and in contact with the absorption region, where the one or more carrier-guiding regions are of a second conductivity type different from the first conductivity type; and one or more sets of switches electrically coupled to the absorption region, where each set of the one or more sets of switches includes: a respective control electrode and a respective readout electrode over the first surface, a respective carrier-collection region under the respective readout electrode and a respective carrier control region under the respective control electrode, where the one or more carrier-guiding regions are separated from the respective carrier-collection region and the respective carrier control region.

Another aspect of the present disclosure features a sensing module, including a transmitter unit, a receiver unit, a signal processor in electrical communication with the receiver unit; and a controller in electrical communication with the processor and the transmitter unit; wherein the receiver unit includes one or more photo-detecting apparatus as described in the present disclosure. In some embodiments the sensing module can be a proximity sensing module or a TOF sensing module.

The details of one or more disclosed implementations are set forth in the accompanying drawings and the description below. Other features, aspects, and advantages will become apparent from the description, the drawings and the claims.

BRIEF DESCRIPTION OF THE DRAWINGS

The foregoing aspects and many of the advantages of this application will become more readily appreciated as the same becomes better understood by reference to the following detailed description, when taken in conjunction with the accompanying drawings:

FIG. 1A illustrates a top view of a photo-detecting apparatus, according to one or more embodiments of the present disclosure.

FIG. 2E illustrates a top view of a photo-detecting apparatus, according to one or more embodiments of the present disclosure.

FIG. 2I illustrates a top view of a photo-detecting apparatus, according to one or more embodiments of the present disclosure.

FIG. 4A illustrates a top view of a photo-detecting apparatus, according to one or more embodiments of the present disclosure.

Like reference numbers and designations in the various drawings indicate like elements.

DETAILED DESCRIPTION

As used herein, the terms such as "first", "second", "third", "fourth" and "fifth" describe various elements, components, regions, layers and/or sections, these elements, components, regions, layers and/or sections should not be limited by these terms. These terms may be only used to distinguish one element, component, region, layer or section from another. The terms such as "first", "second", "third", "fourth" and "fifth" when used herein do not imply a sequence or order unless clearly indicated by the context. The terms "photo-detecting", "photo-sensing", "light-detecting", "light-sensing" and any other similar terms can be used interchangeably.

Spatial descriptions, such as "above", "top", and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the term "intrinsic" means that the semiconductor material is without intentionally adding dopants.

Figure 1B:
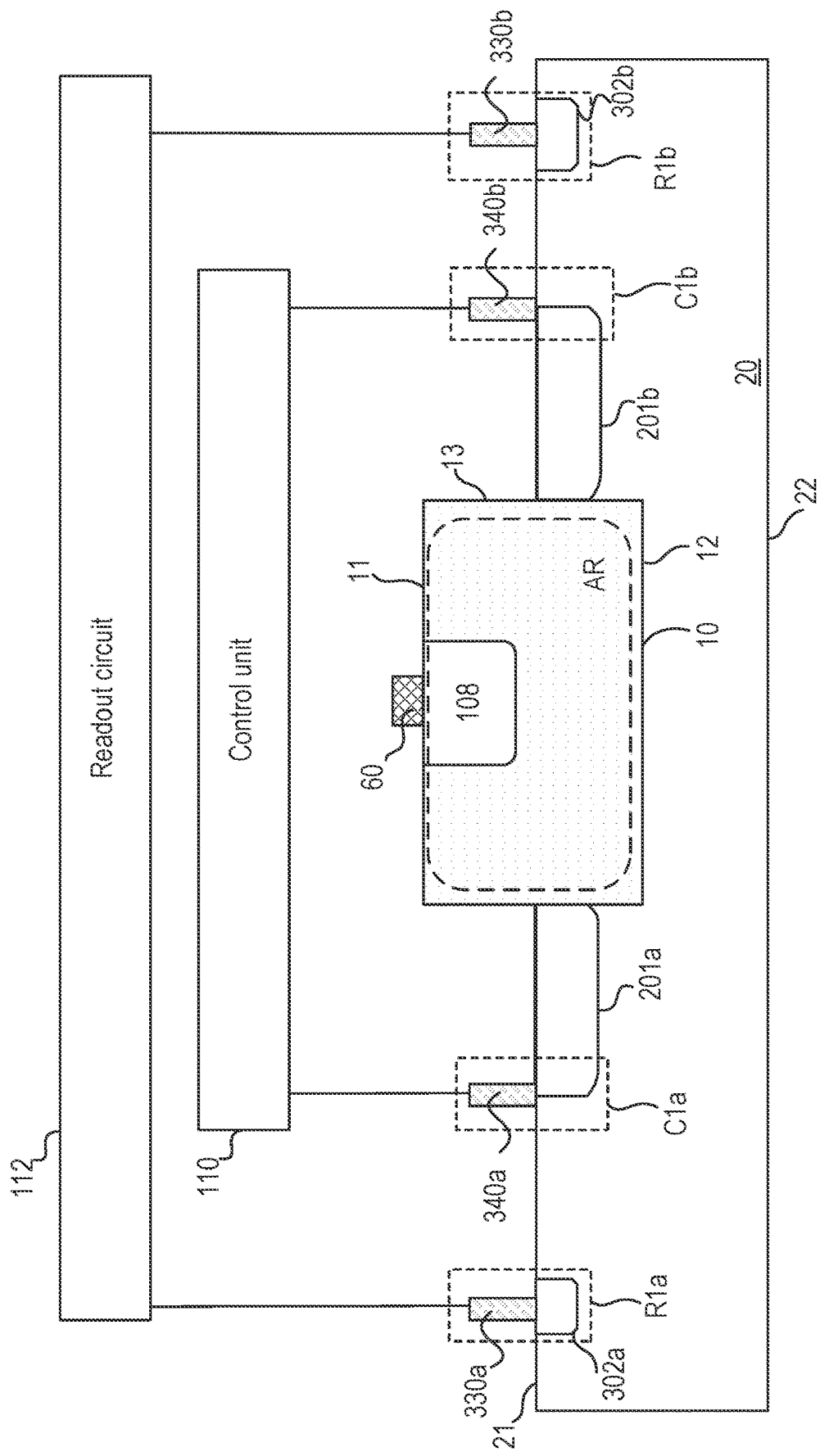
FIG. 1B illustrates a cross-sectional view along an A-A' line in FIG. 1A, according to one or more embodiments of the present disclosure.

FIG. 1A illustrates a top view of a photo-detecting apparatus 100a, according to one or more embodiments. FIG. 1B illustrates a cross-sectional view along an A-A' line in FIG. 1A, according to one or more embodiments.

The photo-detecting apparatus 100a includes a substrate 20 including a first material and an absorption region 10 including a second material, and the absorption region 10 is supported by the substrate 20. In some embodiments, the absorption region 10 includes an optical signal receiving region AR, which is defined by a light shield (not shown) including an optical window. The optical signal receiving region AR is a virtual area receiving an optical signal incoming through the optical window. The absorption region 10 is configured to receive the optical signal and to generate photo-carriers in response to the optical signal.

In some embodiments, the substrate 20 includes a first surface 21 and a second surface 22 opposite to the first surface 21. In some embodiments, the absorption region 10 includes a first surface 11, a second surface 12, and one or more side surfaces 13. The second surface 12 of the absorption region 10 is between the first surface 11 of the absorption region 10 and the second surface 22 of the substrate 20. At least one of the first surface 11, the second surface 12, or the one or more side surfaces 13 of the absorption region 10 is at least partially in direct contact with the substrate 20, and thus a heterointerface can be formed between the absorption region 10 and the substrate 20.

In some implementations, as illustrated in FIG. 1A, the photo-detecting apparatus 100a includes a switch including multiple sets including a first set 102a and a second set 102b, and the absorption region 10 is arranged in between the first set 102a and the second set 102b. Each of the first set 102a and the second set 102b includes a respective control region C1a, C1b and a respective readout region R1a, R1b.

In some embodiments, the respective readout region R1a, R1b includes a corresponding readout electrode 330a, 330b over the first surface 21 of the substrate 20. In some embodiments, as illustrated in FIG. 1B, the respective readout region R1a, R1b further includes a carrier-collection region 302a, 302b under the respective readout electrode 330a, 330b.

In some embodiments, as illustrated in FIG. 1B, the control regions C1a and C1b of the first set 102a and the second set 102b of the multiple sets of the switch are coupled to a control unit 110 and configured to receive the same control signal from the control unit 110. In some embodiments, as illustrated in FIGS. 1A and 1B, the respective control region C1a, C1b includes a control electrode 340a, 340b over the first surface 21 of the substrate 20 and electrically coupled to the control unit 110. That is, the multiple sets (e.g., first set 102a and the second set 102b) of the switch controlled by the same control signal from the control unit 110 are collectively operate as a single switch. The single switch is electrically coupled to the same optical signal receiving region AR or the same absorption region 10 to control the moving direction of the photo-carriers and to collect the photo-carriers from the same optical signal receiving region AR or the same absorption region 10.

By having the absorption region 10 arranged in between the first set 102a and the second set 102b controlled by the same control signal from the control unit 110, the photo-carriers generated by the absorption region 10 can be collected by the readout electrode 330a, 330b of the readout region R1a, Rib, whichever is closer to the photo-carriers to be collected in the absorption region 10. As a result, a travel distance of the photo-carriers is shortened, which increases the speed of the photo-detecting apparatus 100a.

In some embodiments, as illustrated in FIG. 1B, the readout regions R1a, R1b of the first set 102a and the second set 102b of the multiple sets of the switch are coupled to a readout circuit 112 and configured to provide one or more electrical signals to the readout circuit 112. The one or more electrical signals can represent first collective information for deriving time-of-flight (TOF) information associated with the optical signal.

In some embodiments, the readout circuit 112 can be in a three-transistor configuration having a reset gate, a source-follower, and a selection gate, or in a four-transistor configuration including an additional transfer gate, or any suitable circuitry for processing charges collected by the respective readout region. In some embodiments, the multiple sets of the switch are electrically coupled to the same readout circuit 112 and collectively output a single signal, for example, the first set 102a and the second set 102b can collectively output a single total output signal.

In some embodiments, the photo-detecting apparatus 100a further includes one or more carrier-guiding regions 201a and 201b formed at least partially in the substrate 20 and in contact with the absorption region 10. Each of the carrier-guiding region 201a, 201b is electrically coupled to a respective set of the multiple sets of the switch. For example, referring to FIG. 1A, the carrier-guiding region 201a is electrically coupled to the first set 102a of the switch, and the carrier-guiding region 201b is electrically coupled to the second set 102b of the switch.

In some embodiments, the absorption region 10 is doped with a dopant of a first conductivity type (e.g., p-doped), and the carrier-guiding regions 201a, 201b are doped with a second dopant of a second conductivity type (e.g., n-doped) different from the first conductivity type. In some embodiments, the substrate 20 is doped with a dopant of the first conductivity type. The carrier-guiding regions 201a, 201b can be configured to confine a path of the photo-carriers generated from the same absorption region 10 or the same optical signal receiving region AR moving towards the first set 102a and/or the second set 102b. In some embodiments, each of the carrier-guiding regions 201a, 201b has a peak doping concentration between $1 \times 10^{12}$ cm$^{-3}$ and $1 \times 10^{18}$ cm$^{-3}$.

In some embodiments, a ratio of the doping concentration of the first dopant of the absorption region 10 to the doping concentration of the second dopant of the one or more carrier-guiding regions 201a, 201b at the heterointerface between the one or more carrier-guiding regions 201a, 201b and the absorption region 10 is equal to or greater than 10, such that the photo-detecting apparatus 100a can achieve a low dark current at the heterointerface and a high quantum efficiency at the same time.

In some embodiments, e.g., as illustrated in FIG. 1B, the photo-detecting apparatus 100a further includes a first contact region 108 in the absorption region 10 and near the first surface 11 of the absorption region 10. The first contact region 108 is doped with a conductivity type (e.g., p-doped) that is same as the first conductivity type of the absorption region 10. In some embodiments, the first contact region 108 includes a dopant having a peak doping concentration higher than the peak doping concentration of the absorption region 10. For example, the peak doping concentration of the first contact region 108 can be between $1\times10^{18}$ cm$^{-3}$ and $5\times10^{20}$ cm$^{-3}$. The first contact region 108 is for collecting the carriers different from the carriers collected by the carrier-collection region 302a, 302b. For example, if the carrier-collection region 302a is n-doped for collecting electrons, the first contact region 108 is p-doped for collecting holes.

In some embodiments, e.g., as shown in FIG. 1B, the photo-detecting apparatus 100a further includes a first electrode 60 electrically coupled to the first contact region 108. An ohmic contact may be formed between the first electrode 60 and the first contact region 108 depending on the material of the first electrode 60 and the peak doping concentration of the first contact region 108. The first electrode 60 is over the first surface 11 of the absorption region 10.

In some embodiments, the first contact region 108 can be formed in the substrate 20 and in contact with the absorption region 10 and the first electrode 60 is over the first surface 21 of the substrate 20, as described with more details in conjunction with FIG. 2E and FIG. 2I.

Figure 1C:
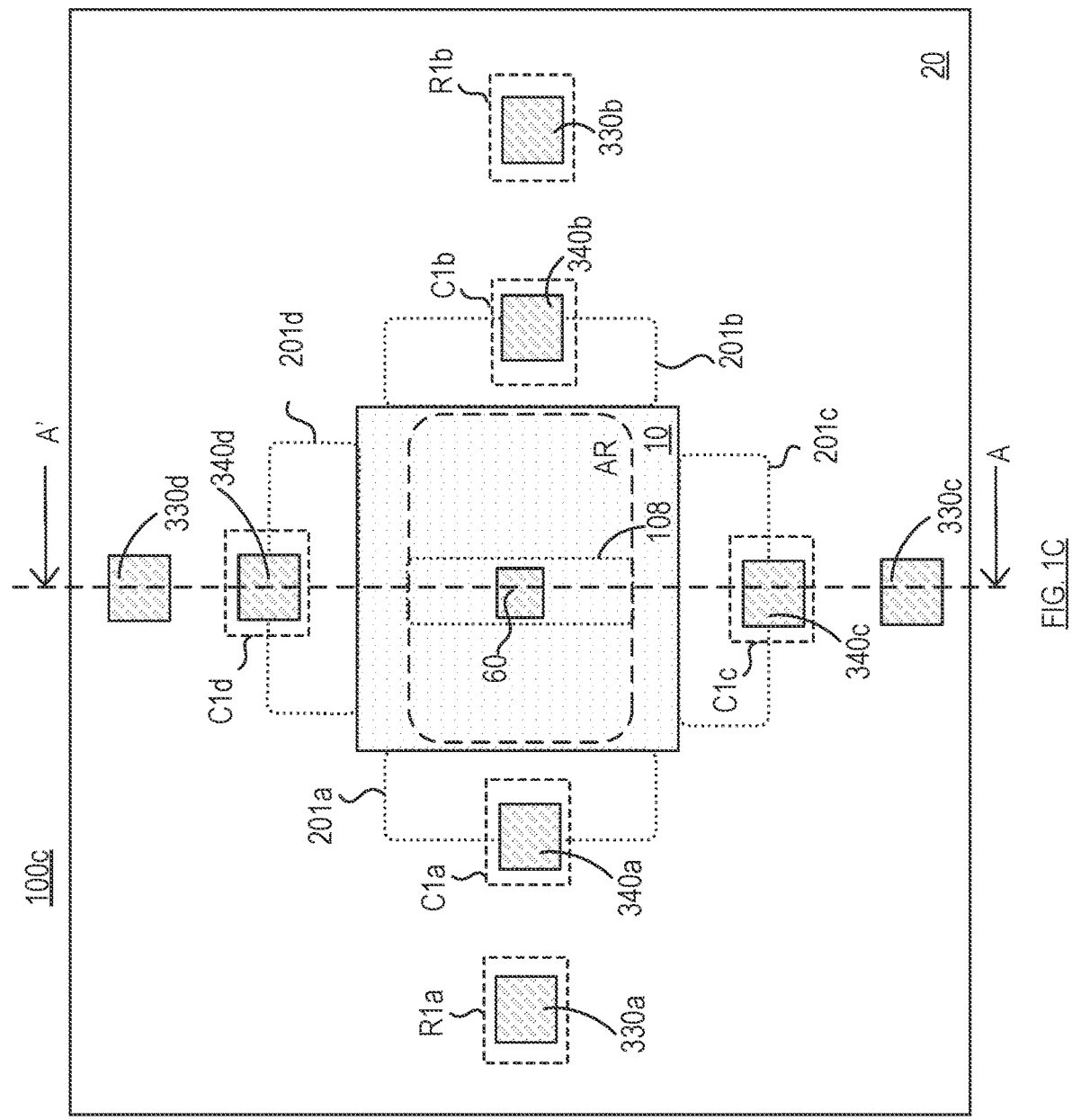
FIG. 1C illustrates a top view of a photo-detecting apparatus, according to one or more embodiments of the present disclosure.

FIG. 1C illustrates a top view of a photo-detecting apparatus 100c, according to one or more embodiments of the present disclosure. The cross-sectional view along an A-A' line in FIG. 1C is similar in FIG. 1B, according to one or more embodiments of the present disclosure. The similar reference numbers and designations indicate similar elements described before. The difference is described below.

Compared to the photo-detecting apparatus 100a of FIGS. 1A-1B including two sets of the switch, the photo-detecting apparatus 100c includes a switch having four sets. As illustrated in FIG. 1C, the absorption region 10 is arranged between the four sets of the switch. Each of the four sets is controlled by the same control signal from the control unit 110. The four sets of the switch are electrically coupled to the same readout circuit 112 and collectively output a single signal, e.g., the four sets collectively output a single total output signal. In some embodiments, a switch of a photo-detecting apparatus can include a number of the sets that is not limited to two or four. The number can be a positive integer no less than 2.

Figure 1D:
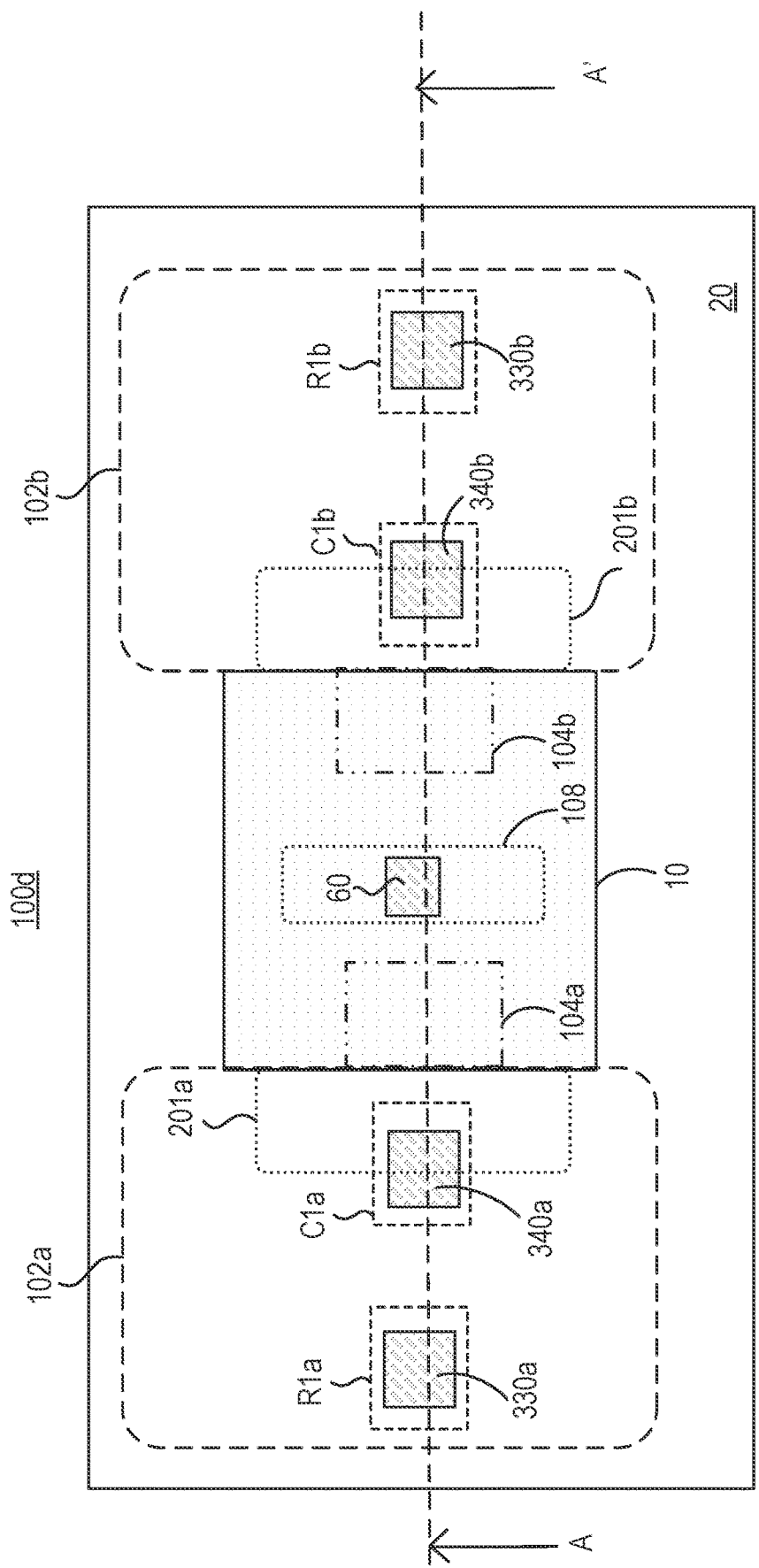
FIG. 1D illustrates a top view of a photo-detecting apparatus, according to one or more embodiments of the present disclosure.
Figure 1E:
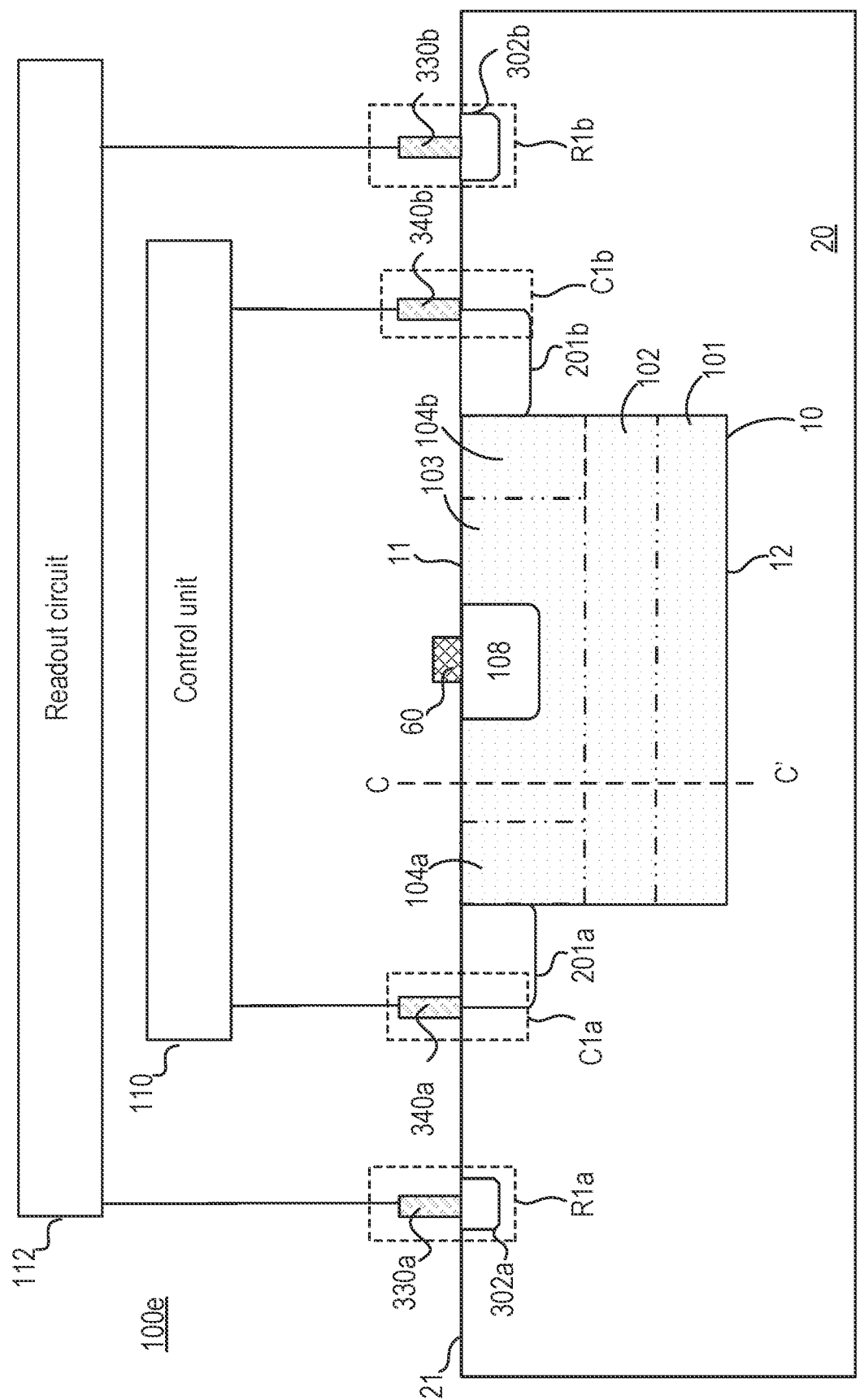
FIG. 1E illustrates a cross-sectional view along an A-A' line in FIG. 1D, according to one or more embodiments of the present disclosure.
Figure 1F:
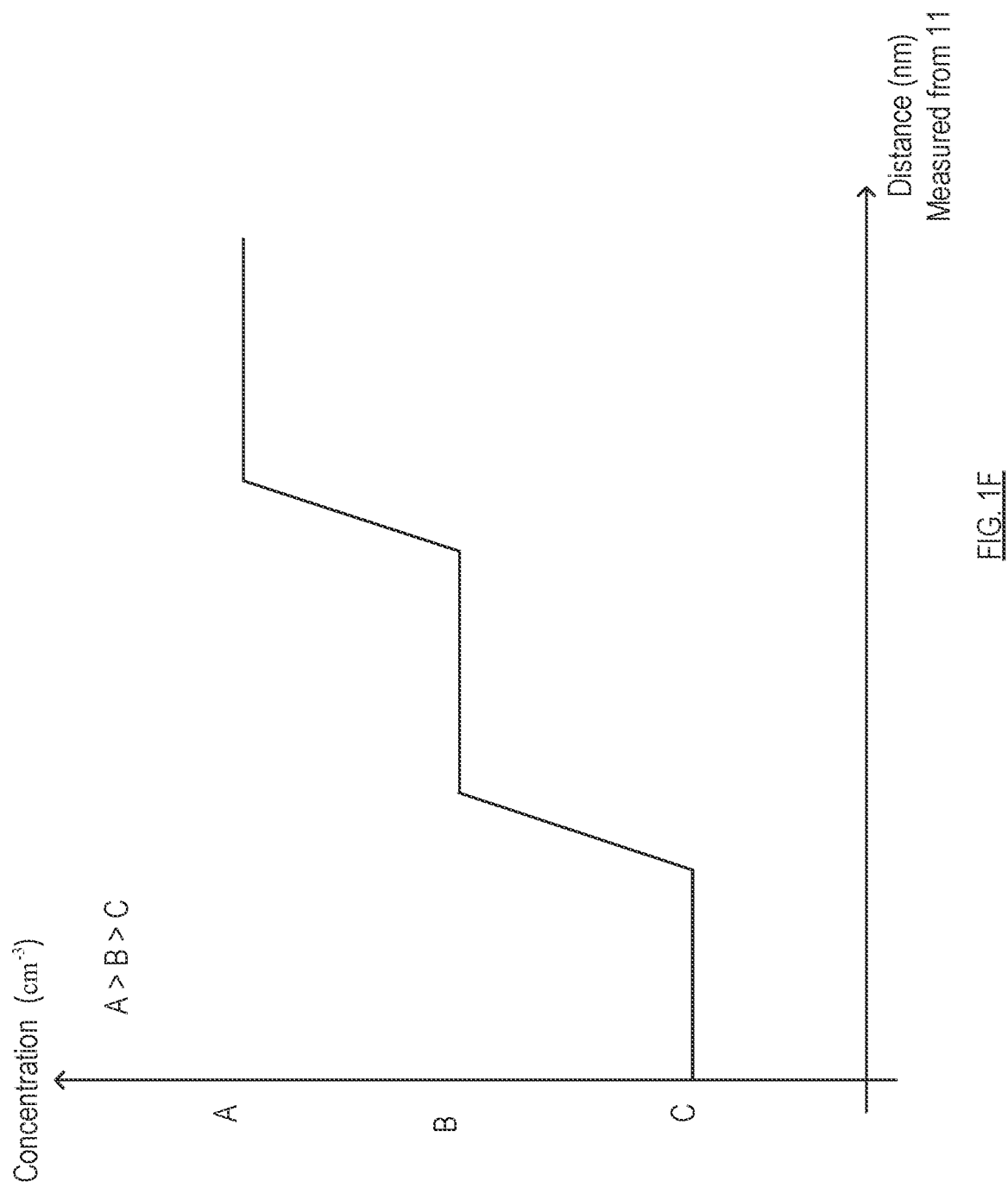
FIG. 1F illustrates a graded doping profile along a C-C' line in FIG. 1E, according to one or more embodiments of the present disclosure.

FIG. 1D illustrates a top view of a photo-detecting apparatus 100d, according to one or more embodiments of the present disclosure. FIG. 1E illustrates a cross-sectional view along an A-A' line in FIG. 1D, according to one or more embodiments of the present disclosure. FIG. 1F illustrates a graded doping profile along a C-C' line in FIG. 1E, according to one or more embodiments of the present disclosure. The similar reference numbers and designations indicate similar elements described before. The difference is described below.

Figure 1G:
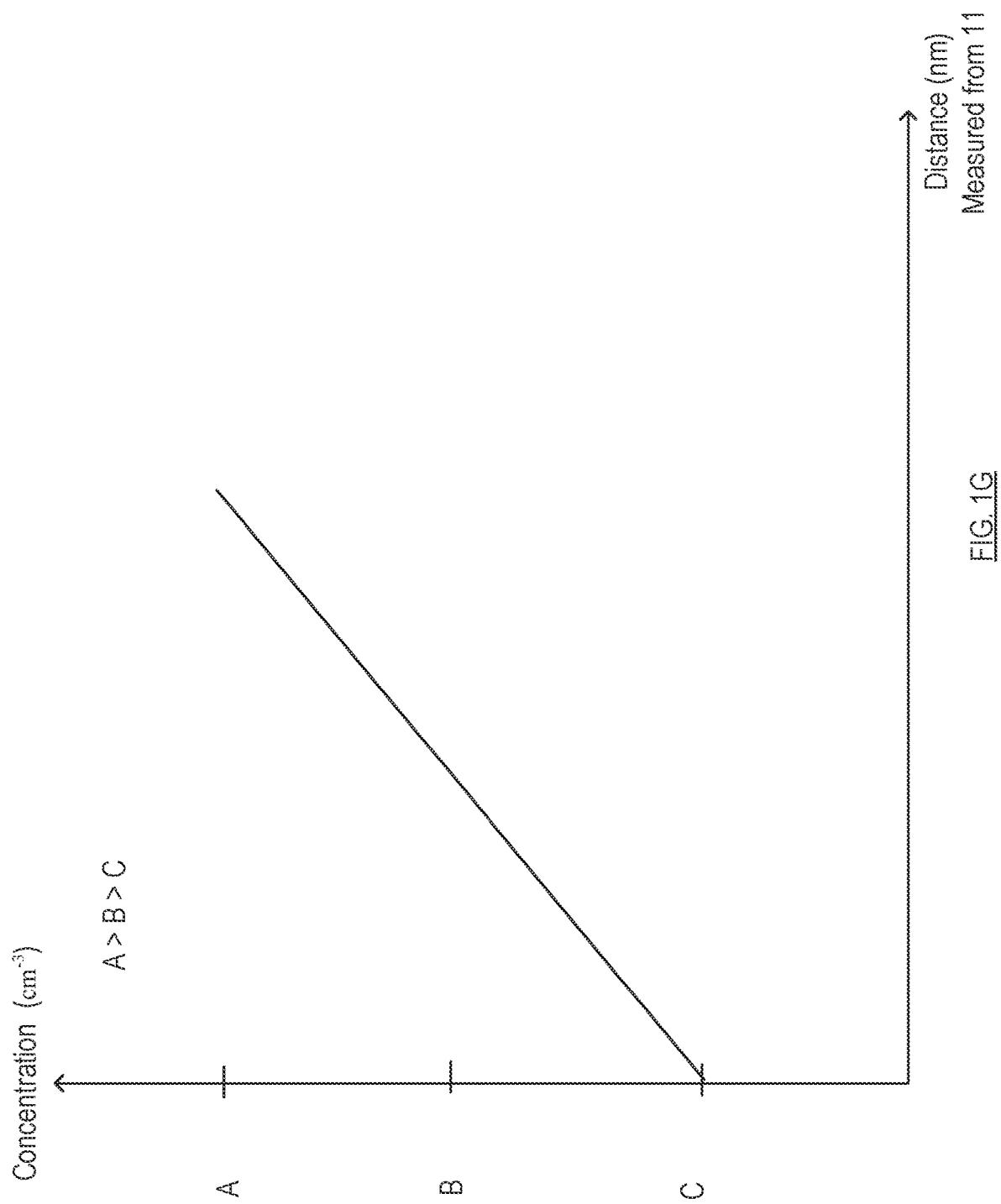
FIG. 1G illustrates another graded doping profile along a C-C' line in FIG. 1E, according to one or more embodiments of the present disclosure.

In some embodiments, the absorption region 10 is doped with a graded doping profile such that at least a part of the absorption region 10 along a horizontal direction and in direct contact with the one or more carrier-guiding regions 201a, 201b is with the lowest doping concentration in the absorption region 10. The horizontal direction is substantially parallel to the first surface 21 of the substrate 20. In some embodiments, the graded doping profile of the absorption region 10 is gradually decreased along a direction from the second surface 12 of the absorption region 10 to the first surface 11 of the absorption region 10. In some embodiments, the absorption region 10 is fully embedded in the substrate 20. For example, referring to FIG. 1E and FIG. 1F, the absorption region 10 may include multiple layers such as, but not limited to three layers 101, 102, 103 with different peak doping concentrations A, B, and C, respectively. The layer 102 is between the layer 101 and the layer 103. The peak doping concentration A is higher than the peak doping concentration B, which is higher than peak doping concentration C. Referring to FIG. 1F, the graded doping profile can be a step-like concentration distribution. For another example, referring to FIG. 1G, the graded doping profile can be a gradient distribution. Since the graded doping profile of the absorption region 10 is gradually decreased along a direction from the second surface 12 of the absorption region 10 to the first surface 11 of the absorption region 10, the carriers to be collected (e.g., electrons, when the carrier-guiding regions 201a, 201b are n-doped) can be driven to move towards the one or more carrier-guiding regions 201a, 201b, which are near the first surface 11 of the absorption region 10.

In some embodiments, as illustrated in FIGS. 1D and 1E, the absorption region 10 further includes a plurality of carrier-output regions 104a, 104b each in contact with a respective carrier-guiding region 201a, 201b. In some embodiments, the carrier-output regions 104a, 104b are with a peak doping concentration lower than the peak doping concentration C in the bulk of the absorption region 10. The carrier-output regions 104a, 104b can further facilitate the carriers moving from the absorption region 10 to the carrier-guiding regions 201a, 201b.

Figure 2A:
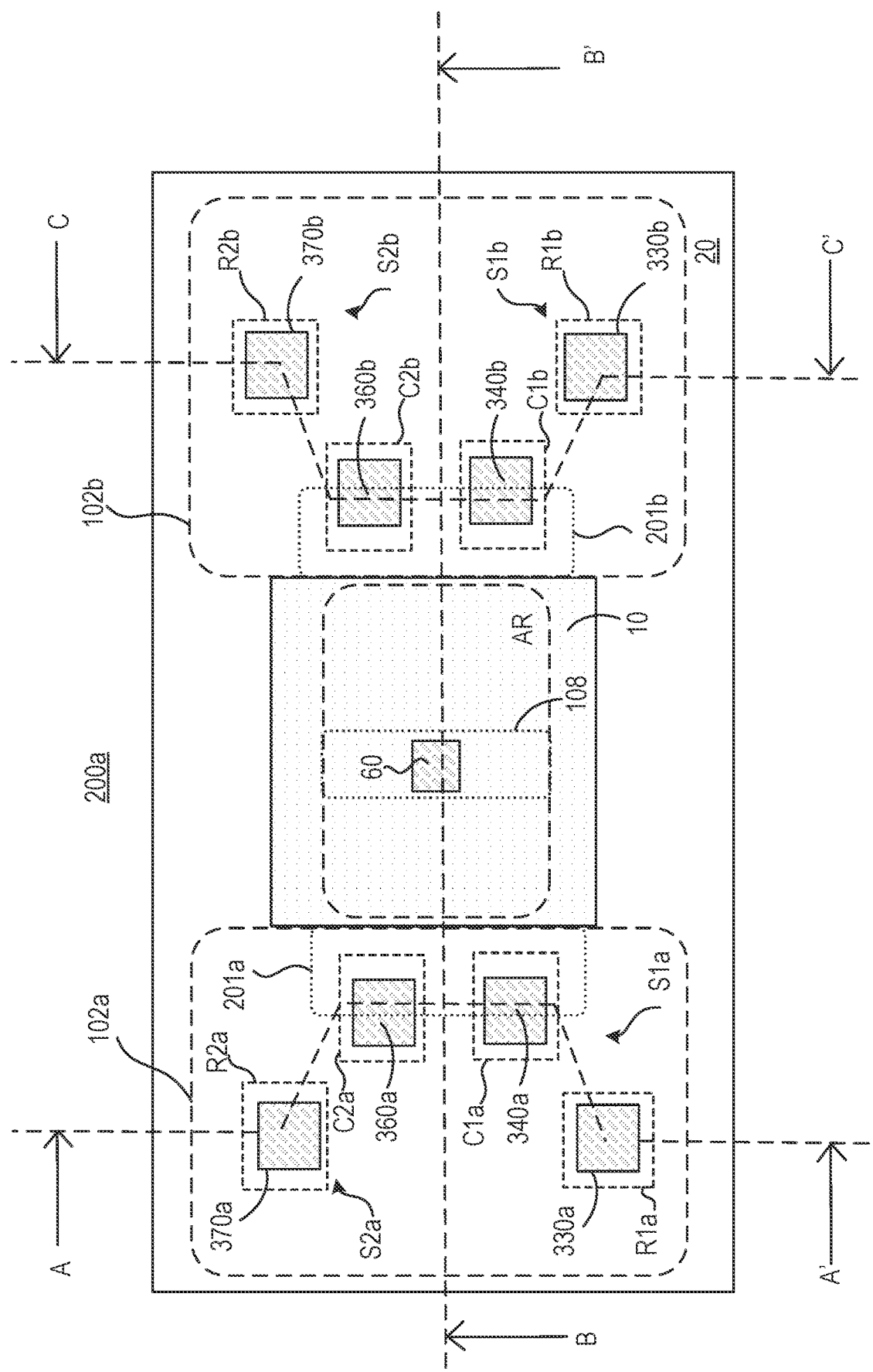
FIG. 2A illustrates a top view of a photo-detecting apparatus, according to one or more embodiments of the present disclosure.
Figure 2B:
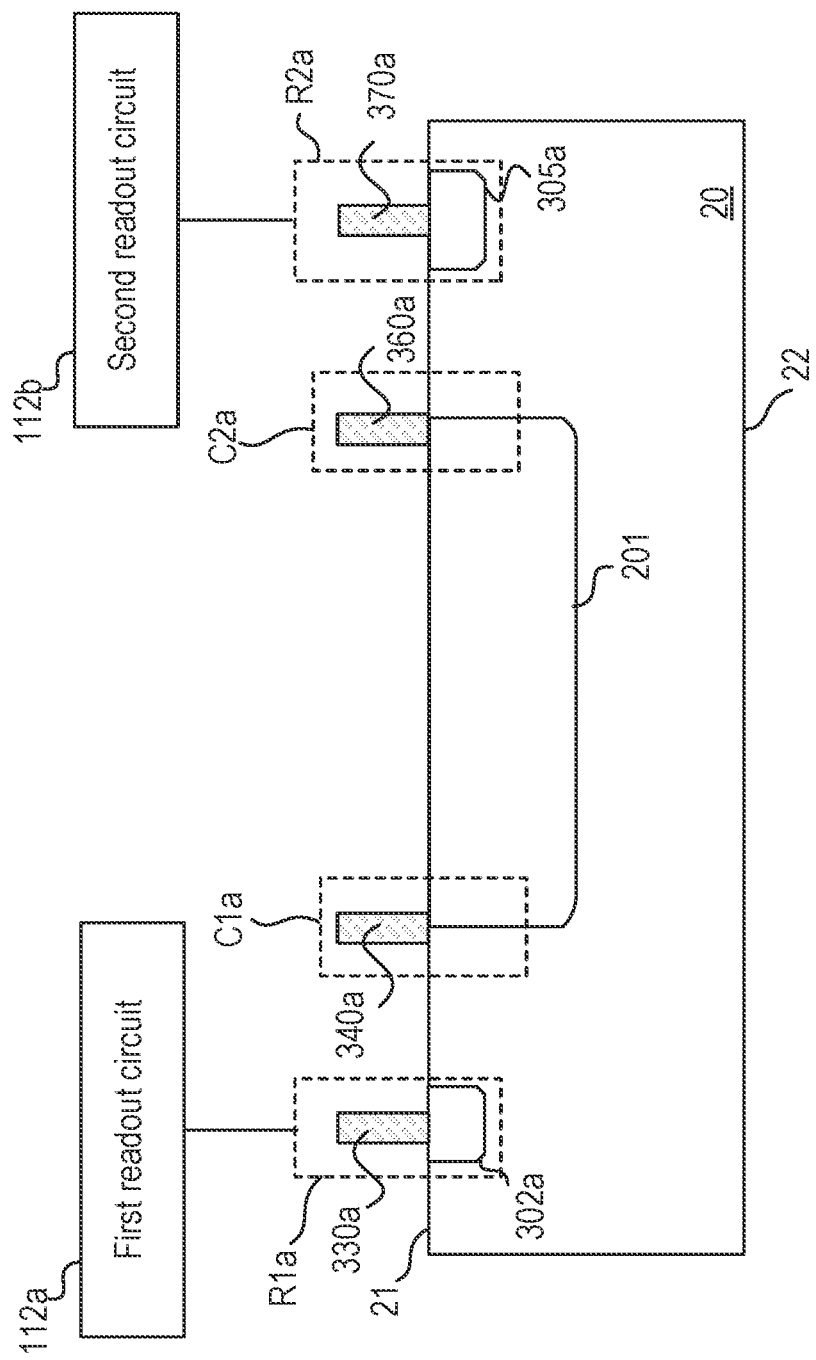
FIG. 2B illustrates a cross-sectional view along an A-A' line in FIG. 2A, according to one or more embodiments of the present disclosure.
Figure 2C:
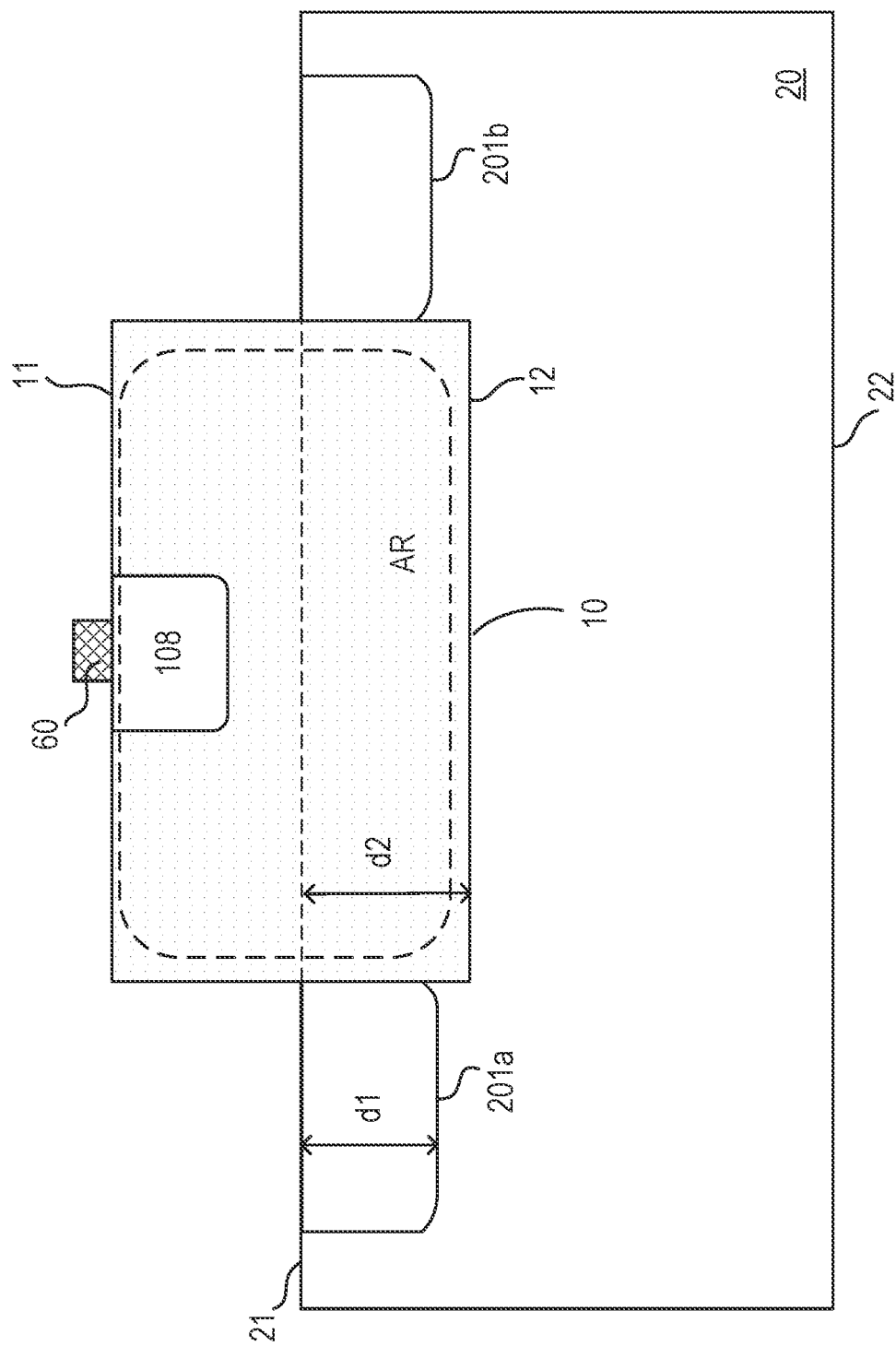
FIG. 2C illustrates a cross-sectional view along a B-B' line in FIG. 2A, according to one or more embodiments of the present disclosure.

FIG. 2A illustrates a top view of a photo-detecting apparatus 200a, according to one or more embodiments of the present disclosure. FIG. 2B illustrates a cross-sectional view along an A-A' line in FIG. 2A, according to one or more embodiments of the present disclosure. FIG. 2C illustrates a cross-sectional view along a B-B' line in FIG. 2A, according to one or more embodiments of the present disclosure. In some embodiments, a cross-sectional view along a C-C' line in FIG. 2A is similar to the cross-sectional view shown in FIG. 2B except that the label reference may be different. The similar reference numbers and designations indicate similar elements described before. The detailed disclosure of the photo-detecting apparatus 200a is described below.

In some embodiments, the photo-detecting apparatus 200a includes multiple sets of switches 102a, 102b. The absorption region 10 is supported by the substrate 20 and configured to receive an optical signal and to generate photo-carriers in response to the optical signal. In some implementations, the photo-detecting apparatus 200a includes N sets (N≥2) of switches electrically coupled to the absorption region 10, where each set of the switches 102a, 102b includes a respective first switch S1a, S1b and a respective second switch S2a, S2b. Each of the first switches S1a, S1b and the second switches S2a, S2b includes a respective control electrode 340a, 340b, 360a, 360b and a respective readout electrode 330a, 330b, 370a, 370b over the first surface 21. For example, a first set of switches 102a includes the respective first switch S1a and the respective second switch S2a, and a second set of the switches 102b includes the respective first switch S1b and the respective second switch S2b. The first switch S1a can include the respective control electrode 340a and the respective readout electrode 330a. The second switch S2a can include the respective control electrode 360a and the respective readout electrode 370a. The first switch S1b can include the respective control electrode 340b and the respective readout electrode 330b. The second switch S2b can include the respective control electrode 360b and the respective readout electrode 370b.

The absorption region 10 can be arranged in between two sets of the N sets of switches, e.g., two sets 102a, 102b in FIG. 2A. For example, referring to FIG. 2A, the absorption region 10 is arranged in between the two sets of the switches 102a, 102b. The first switches S1a, S1b of the N sets of switches are controlled by a first control signal to collectively operate as a single switch (e.g., first single switch), and the second switches S2a, S2b of the N sets of switches are controlled by a second control signal different from the first control signal to collectively operate as another single switch (e.g., second single switch). The first single switch and the second single switch are electrically coupled to the same optical signal receiving region AR or the same absorption region 10 to control the moving direction of the photo-carriers and to collect the photo-carriers from the same optical signal receiving region AR or the same absorption region 10.

By having the absorption region 10 arranged in between at least two sets of the N sets of switches where the first switches S1a, S1b of the two sets of the switches are controlled by the same first control signal and the second switches S2a, S2b of the two sets of the switches are controlled by the same second control signal, when the first switches S1a, S1b are on, the photo-carriers generated by the absorption region 10 can be collected by the readout electrode 330a or 330b of one of the first switches S1a, S1b, whichever is closer to the photo-carriers to be collected in the absorption region 10. When the second switches S2a, S2b are on, the photo-carriers generated by the absorption region 10 can be collected by the readout electrode 370a or 370b of one of the second switches S2a, S2b, whichever is closer to the photo-carriers to be collected in the absorption region 10. As a result, a travel distance of the photo-carriers is shortened, which increases the speed of the photo-detecting apparatus 200a. Collectively, the photo-carriers collected by all of the first switches S1a, S1b can be processed together to operate as a single switch, and the photo-carriers collected by all of the second switches S2a, S2b can be processed together to operate as another single switch. Although not shown in the figures, more than two switches can be implemented using the multiple sets of switches as described in FIGS. 2A to 2C.

In some embodiments, the photo-detecting apparatus 200a includes one or more carrier-guiding regions 201a, 201b formed at least partially in the substrate 20 and in contact with the absorption region 10, where each of the one or more carrier-guiding regions 201a, 201b is electrically coupled to a respective set 102a, 102b of the N sets of switches.

In some embodiments, the photo-detecting apparatus 200a further includes one or more readout circuits (e.g., first readout circuit 112a and second readout circuit 112b as shown in FIG. 2B) electrically to the respective switch. In some embodiments, the photo-carriers collected by the first switches S1a, S1b of the N sets of switches can be processed together by a first readout circuit 112a, and the photo-carriers collected by the second switches S2a, S2b of the N sets of switches can be processed together by a second readout circuit 112b. In some embodiments, the first readout circuit 112a or the second readout circuit 112b may be in a three-transistor configuration having a reset gate, a source-follower, and a selection gate, or in a four-transistor configuration including an additional transfer gate, or any suitable circuitry for processing collected charges.

In some embodiments, the first control signal and the second control signal, control the control regions C1a, C1b of the first switches S1a, S1b, and the control regions C2a, C2b of the second switches S2a, S2b respectively for controlling the moving direction of the electrons or holes generated by the absorbed photons in the absorption region 10. In some embodiments, the first control signal is different from the second control signal. For example, when control signals are used to provide different voltages and thus generate bias voltage, an electric field is created between the two portions right under the control electrodes of the respective switch, e.g., the two portions right under the control electrodes 340a, 340b of the first switches S1a, S1b, and the two portions right under the control electrodes 360a, 360b of the second switches S2a, S2b as well as in the absorption region 10. Free carriers in the absorption region 10 then drift towards one of the portions right under the readout electrodes 330a, 330b, 370a, 370b depending on the direction of the electric field and the distance and then be collected by the readout electrode 330a, 330b, 370a, 370b. For example, when control signals are used to provide different voltages and thus generate bias voltage, 1, which turns on the first switches S1a, S1b, an electric field is created to drive the photo-carriers in the absorption region 10 drift towards the readout electrodes 330a, 340a. The photo-carriers then be collected by one of the readout electrodes 330a, 340a, whichever is closer to the photo-carriers to be collected in the absorption region 10. The collected photo-carriers are further processed by the same readout circuit (e.g., the first readout circuit 112a) electrically coupled to the readout electrodes 330a, 340a, afterwards. As a result, a travel distance of the photo-carriers is shortened, which increases the speed of the photo-detecting apparatus 200a.

In some embodiments, the first control signal includes a first control phase, and the second control signal includes a second control phase, where the first control phase is not overlapped with the second control phase. In some embodiments, the first control signal is fixed at a voltage value V, and the second control signal is alternate between voltage values V±ΔV. In some embodiments, ΔV is generated by a varying voltage signal, e.g., sinusoid signal, clock signal or pulse signal operated between 0V and 3V. The direction of the bias value determines the drift direction of the carriers generated from the absorption region 10. In some embodiments, the control signals are modulated signals.

Referring to FIG. 2C, in some embodiments, the absorption region 10 is at least partially embedded in the substrate 20. In some embodiments, a depth d1 of the one or more carrier-guiding region 201a, 201b in the substrate 20 is less than a depth d2 of the absorption region 10 in the substrate 20. Since the depth d1 of the one or more carrier-guiding regions 201a, 201b is less than the depth d2 of the absorption region 10, an area of the interface between the carrier-guiding region 201 and the absorption region 10 is reduced, which lowers the dark current of the photo-detecting apparatus 200a.

Figure 2D:
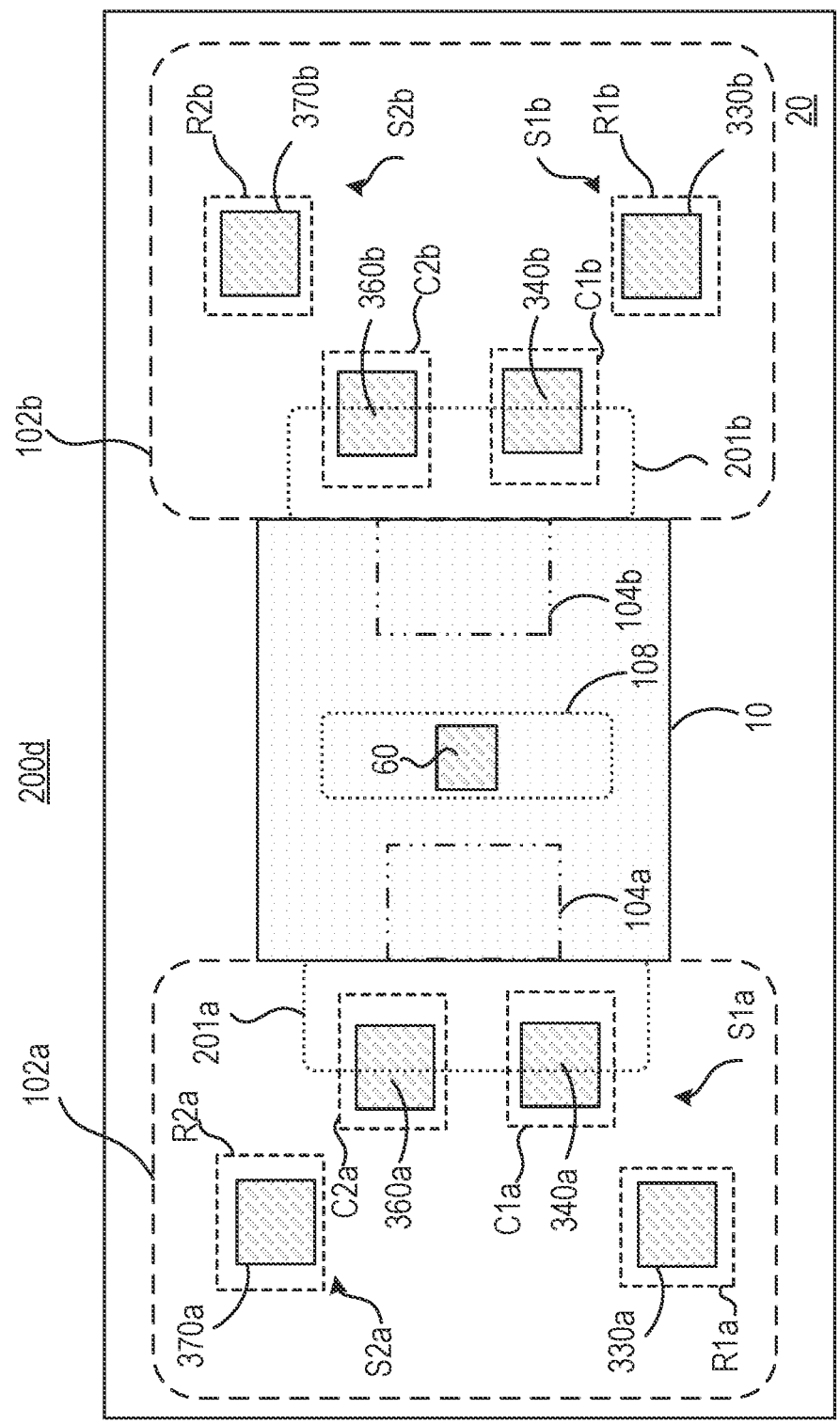
FIG. 2D illustrates a top view of a photo-detecting apparatus, according to one or more embodiments of the present disclosure.

FIG. 2D illustrates a top view of a photo-detecting apparatus 200d, according to one or more embodiments of the present disclosure. The photo-detecting apparatus 200d can be similar to the photo-detecting apparatus 200a of FIGS. 2A-2C. However, different from the photo-detecting apparatus 200a, the photo-detecting apparatus 200d includes an absorption region 10 that can be doped with a graded doping profile as described in FIG. 1D, 1E, 1F, or 1G. For example, similar to the absorption region 10 in the photo-detecting apparatus 100d of FIGS. 1D and 1E, in the photo-detecting apparatus 200d, the absorption region 10 can include a plurality of carrier-output regions 104a, 104b each in contact with a respective carrier-guiding region 201a, 201b. In some embodiments, the carrier-output regions 104a, 104b are with a peak doping concentration lower than the peak doping concentration C in the bulk of the absorption region 10. The carrier-output regions 104a, 104b can further facilitate the carriers moving from the absorption region 10 to the carrier-guiding regions 201a, 201b.

Figure 2F:
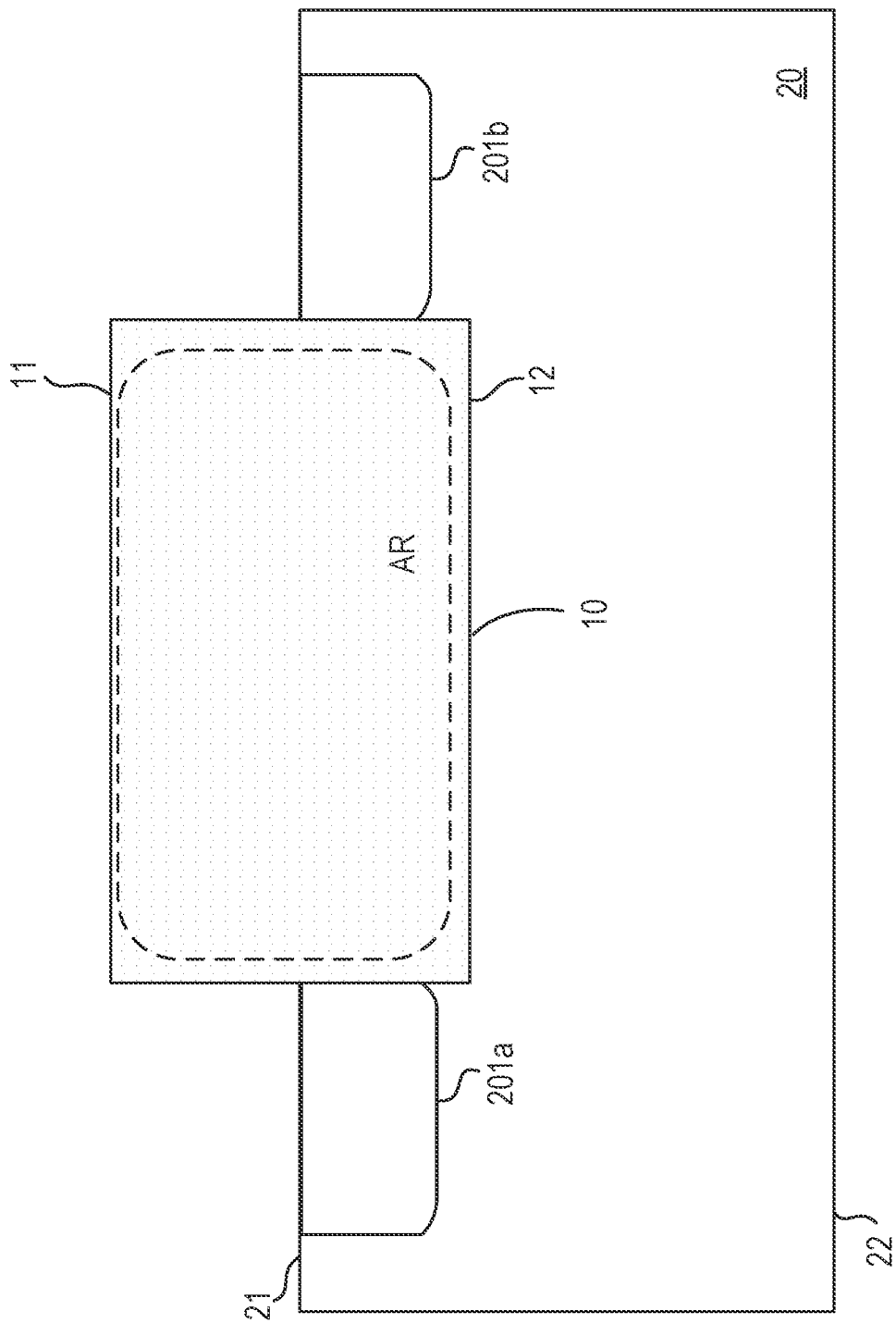
FIG. 2F illustrates a cross-sectional view along a B-B' line in FIG. 2E, according to one or more embodiments of the present disclosure.

FIG. 2E illustrates a top view of a photo-detecting apparatus 200e, according to one or more embodiments of the present disclosure. FIG. 2F illustrates a cross-sectional view along a B-B' line in FIG. 2E, according to one or more embodiments of the present disclosure. The photo-detecting apparatus 200e can be similar to the photo-detecting apparatus 200a of FIGS. 2A-2C. A cross-sectional view along an A-A' line and C-C' line in FIG. 2E can be similar to the cross-sectional views shown in FIG. 2B except that the label reference may be different. The similar reference numbers and designations indicate similar elements described before. The difference is described below.

Compared to the photo-detecting apparatus 200a including a first contact region 108 formed in the absorption region 10, the photo-detecting apparatus 200e, as illustrated in FIG. 2E, can include multiple first contact regions 108 that can be formed in the substrate 20 and in contact with the absorption region 10. Multiple first electrodes 60 can be over the first surface 21 of the substrate 20 and electrically coupled to the respective first contact regions 108. Since the first electrodes 60, the readout electrodes 330a, 330b, 370a, 370b, and the control electrodes 340a, 340b, 360a, 360b, can be formed over the same first surface 21 of the substrate 20, a height difference between the electrodes can be lower.

Figure 2G:
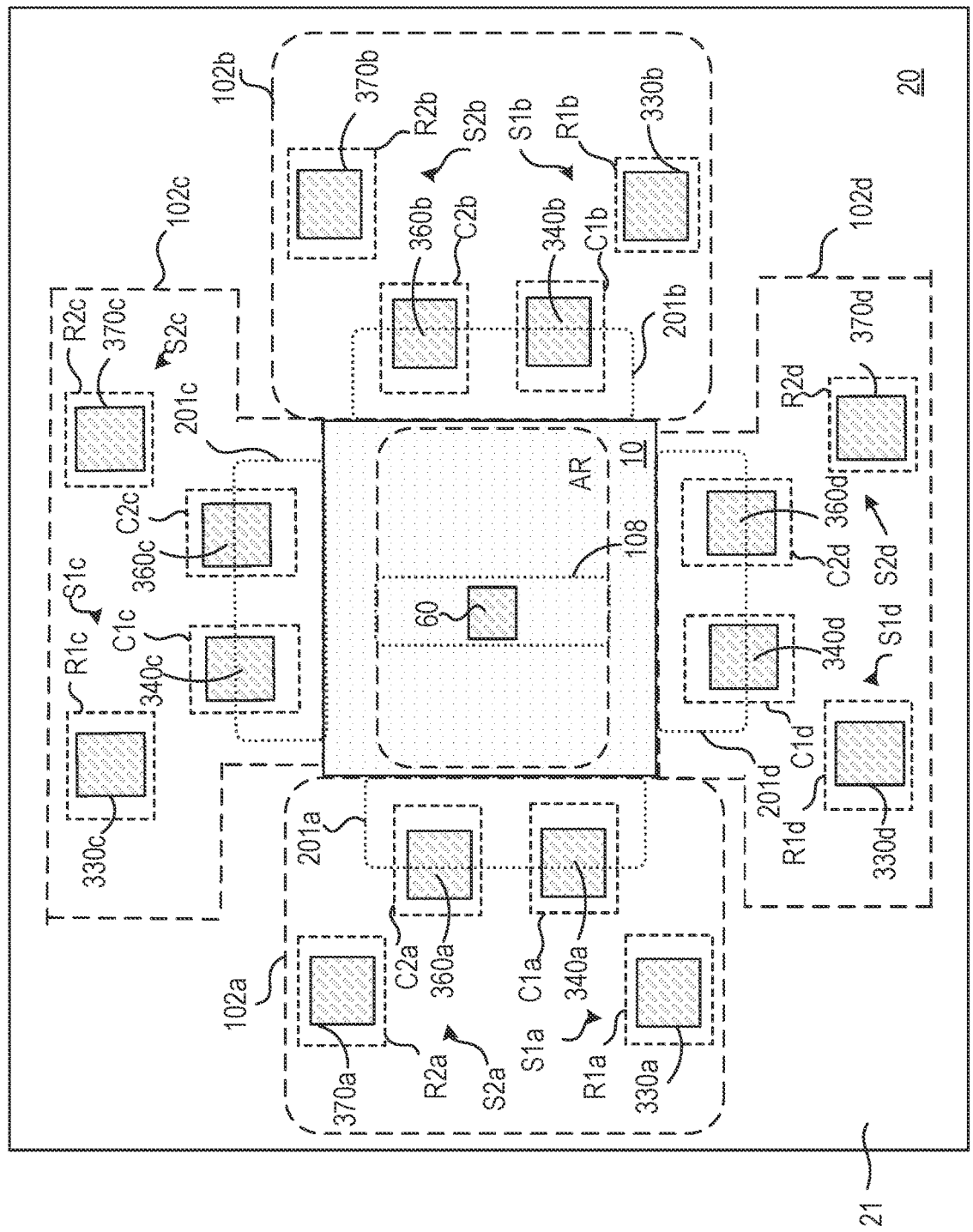
FIG. 2G illustrates a top view of a photo-detecting apparatus, according to one or more embodiments of the present disclosure.

FIG. 2G illustrates a top view of a photo-detecting apparatus 200g, according to one or more embodiments of the present disclosure. The photo-detecting apparatus 200g can be similar to the photo-detecting apparatus 200a of FIGS. 2A-2C. The similar reference numbers and designations indicate similar elements described before. The difference is described below.

In some embodiments, the absorption region 10 includes M sides, and N sets of switches are each disposed at one of the sides of the absorption region 10, respectively, where M and N are integers and M≥N. For example, referring to FIG. 2G, the absorption region 10 includes four sides. Four sets of switches 102a, 102b, 102c, 102d are each disposed at a respective side of the four sides. In some embodiments, the absorption region 10 is between carrier-guiding regions 201a, 201b, 201c, 201d. The number of the sets of switches 102a, 102b, 102c, 102d is four and the number of the carrier-guiding regions 201a, 201b, 201c, 201d is four. In some embodiments, the number of the sets of the switch is not limited to two or four. The number is a positive integer and is ≥2.

As illustrated in FIG. 2G, the first set of switches 102a includes: a first switch S1a having a first control region C1a with a control electrode 340a and a first readout region R1a with a readout electrode 330a, and a second switch S2a having second control region C2a with a control electrode 360a and a second readout region R2a with a readout electrode 370a. The second set of switches 102b includes: a first switch S1b having a first control region C1b with a control electrode 340b and a first readout region R1b with a readout electrode 330b, and a second switch S2b having a second control region C2b with a control electrode 360b and a second readout region R2b with a readout electrode 370b. The third set of switches 102c includes: a first switch S1c having a first control region C1c with a control electrode 340c and a first readout region R1c with a readout electrode 330c, and a second switch S2c having second control region C2c with a control electrode 360c and a second readout region R2c with a readout electrode 370c. The fourth set of switches 102d includes: a first switch S1d having a first control region C1d with a control electrode 340d and a first readout region R1d with a readout electrode 330d, and a second switch S2d having second control region C2d with a control electrode 360d and a second readout region R2d with a readout electrode 370d.

In some embodiments, the first control signal controls the control regions C1a, C1b, C1c, C1d of the first switches S1a, S1b, S1c, S1d, and the second control signal controls the control regions C2a, C2b, C2c, C2d of the second switches S2a, S2b, S2c, S2d for controlling the moving direction of the electrons or holes generated by the absorbed photons in the absorption region 10. For example, when the first switches S1a, S1b, S1c, S1d of the four sets of switches 102a, 102b, 102c, 102d are on, the photo-carriers then be collected by one of the readout electrodes 330a, 330b, 330c, 330d, whichever is closer to the photo-carriers to be collected in the absorption region 10.

Figure 2H:
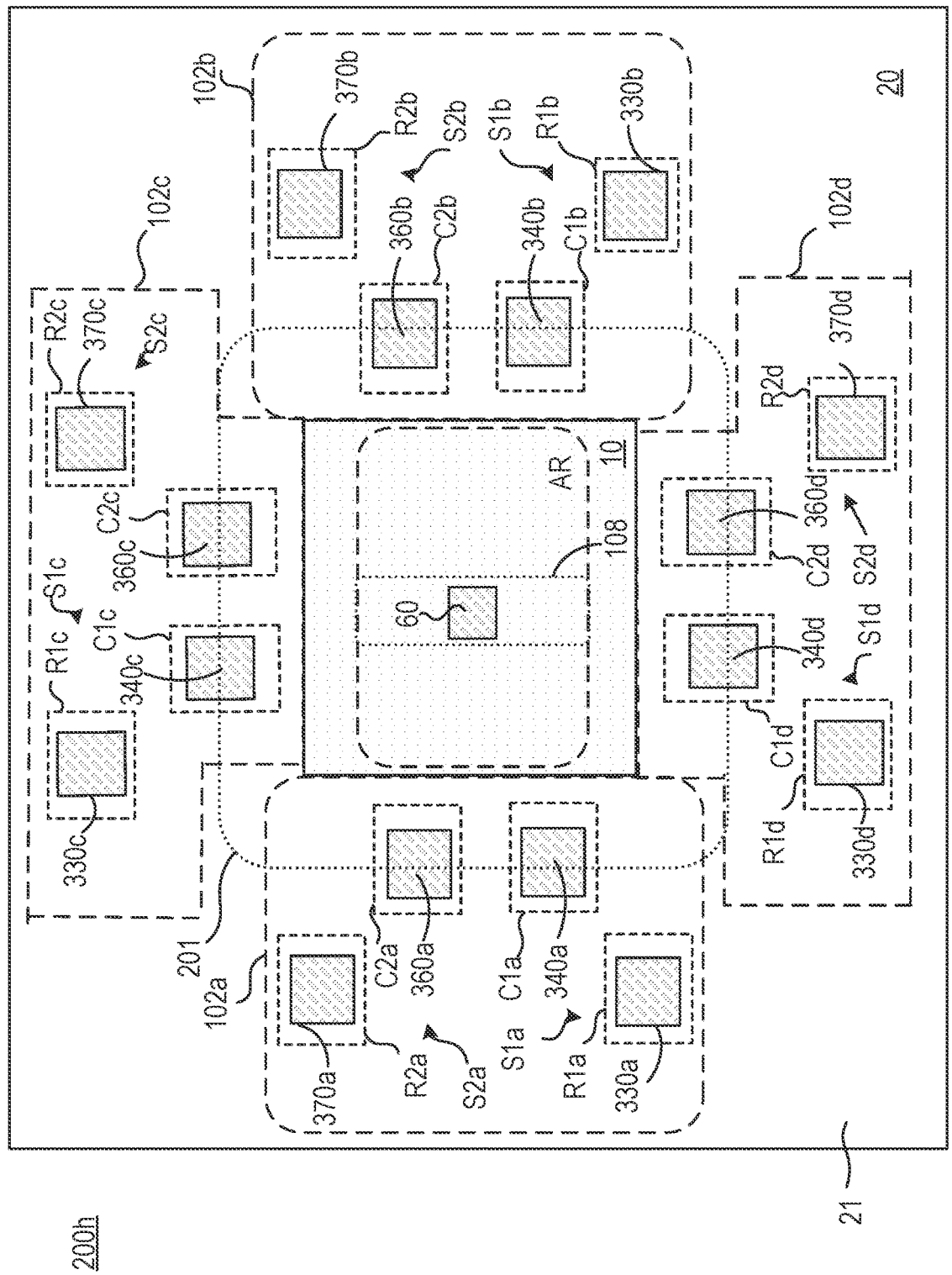
FIG. 2H illustrates a top view of a photo-detecting apparatus, according to one or more embodiments of the present disclosure.
Figure 21:
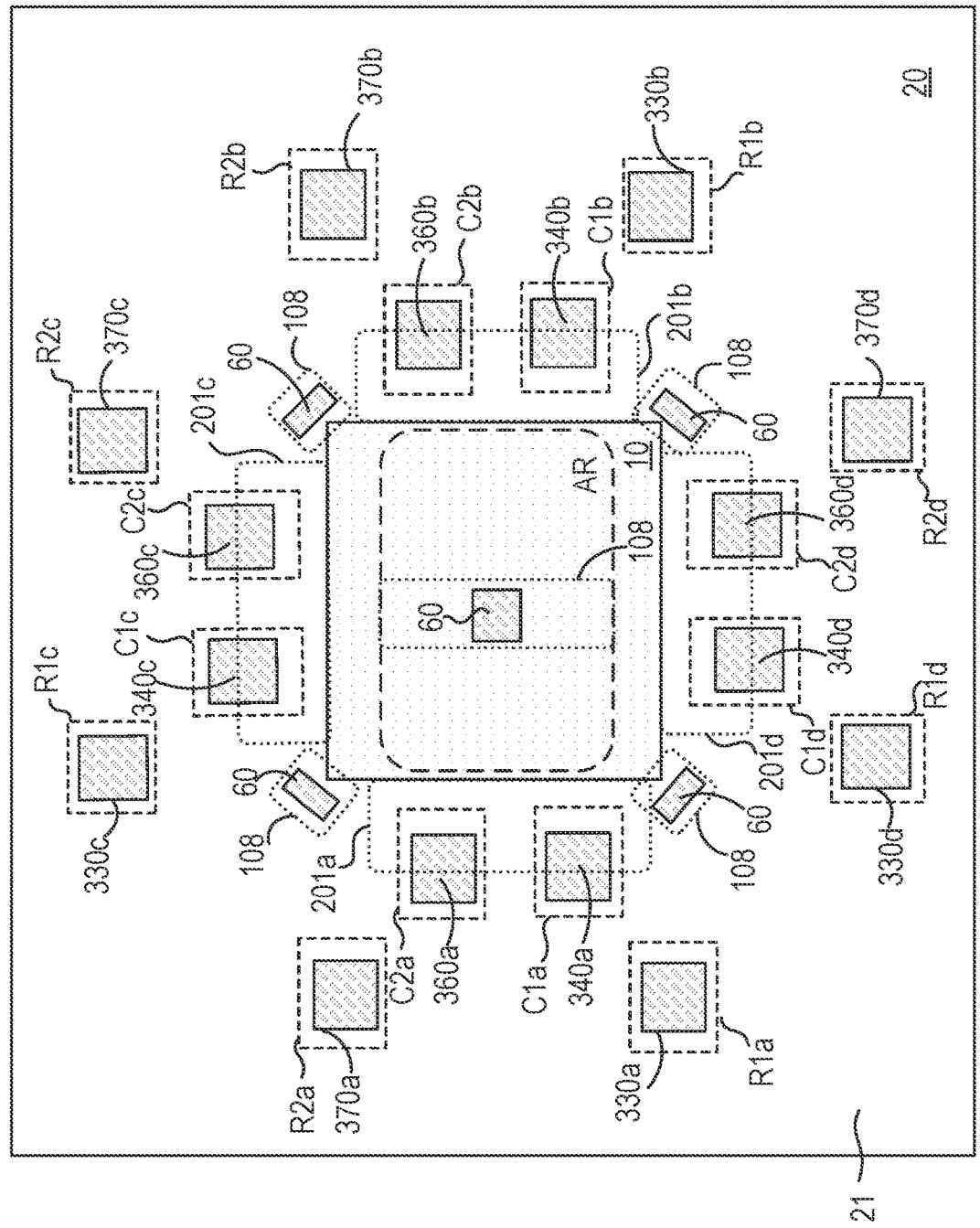

FIG. 2H illustrates a top view of a photo-detecting apparatus 200h, according to one or more embodiments of the present disclosure. The photo-detecting apparatus 200h is similar to the photo-detecting apparatus 200g of FIG. 2G. The similar reference numbers and designations indicate similar elements described before.

In the photo-detecting apparatus 200g, the absorption region 10 is between four carrier-guiding regions 201a, 201b, 201c, 201d, and the four sets of switches 102a, 102b, 102c, 102d are electrically coupled to the corresponding carrier-guiding regions 201a, 201b, 201c, 201d. In comparison, in the photo-detecting apparatus 200h, the four sets of switches 102a, 102b, 102c, 102d are electrically coupled to the same carrier guiding region 201, and the absorption region 10 is surrounded by the carrier guiding region 201.

FIG. 2I illustrates a top view of a photo-detecting apparatus 200i, according to one or more embodiments of the present disclosure. The photo-detecting apparatus 200i is similar to the photo-detecting apparatus 200g of FIG. 2G. The similar reference numbers and designations indicate similar elements described before. The difference is described below.

In the photo-detecting apparatus 200g, a first contact region 108 is formed in the absorption region 10. In comparison, in the photo-detecting apparatus 200i, as illustrated in FIG. 2I, multiple first contact regions 108 can be formed in the substrate 20 and be outside of the absorption region 10 but in contact with the absorption region 10. Multiple first electrodes 60 are over the first surface 21 of the substrate 20 and electrically coupled to the respective first contact regions 108. Since the first electrode 60, the readout electrodes 330a, 330b, 330c, 330d, 370a, 370b, 370c, 370d and the control electrodes 340a, 340b, 340c, 340d, 360a, 360b, 360c, 360d can be formed over the same first surface 21 of the substrate 20, a height difference between the electrodes can be lower.

Figure 3A:
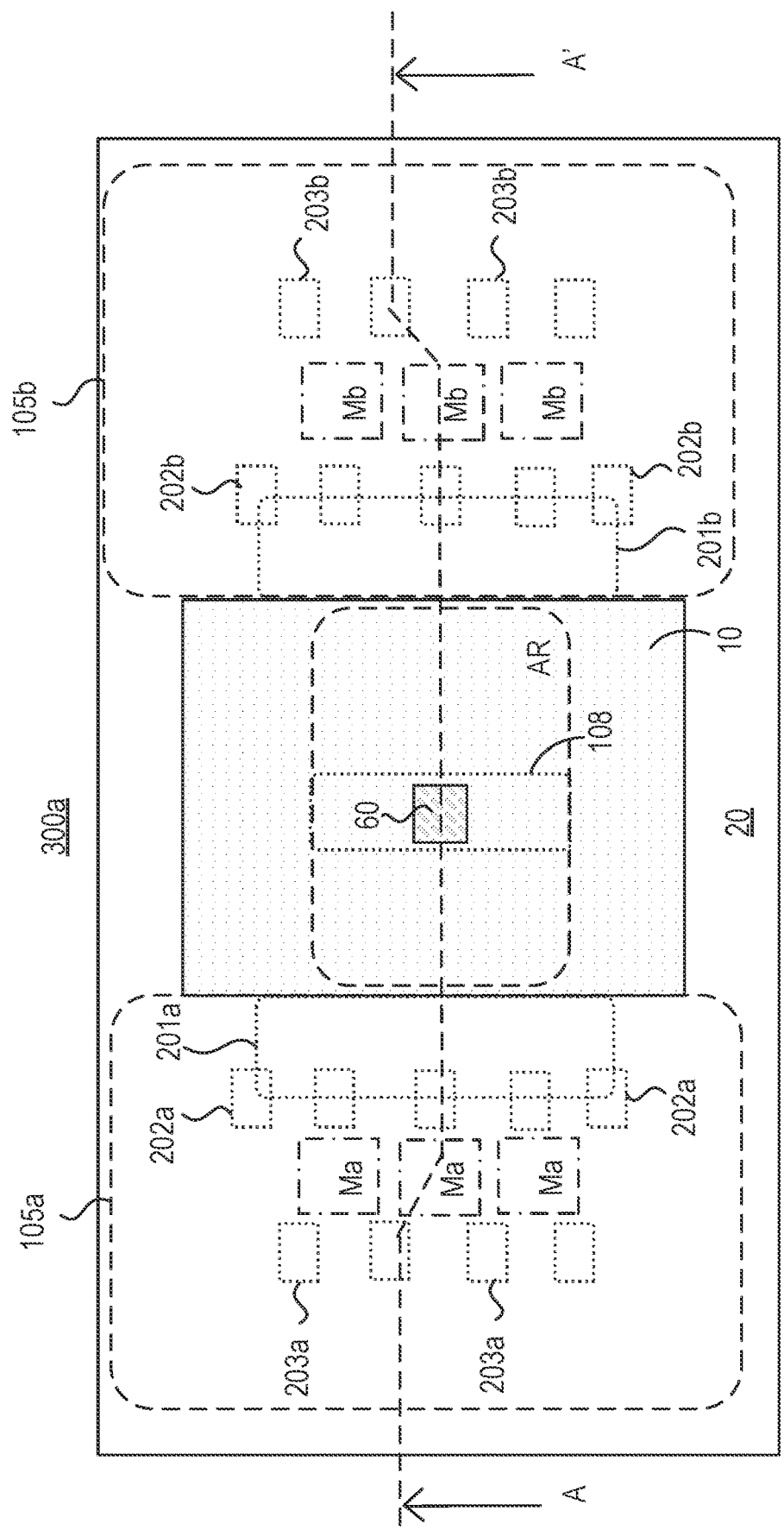
FIG. 3A illustrates a top view of a photo-detecting apparatus, according to one or more embodiments of the present disclosure.
Figure 3B:
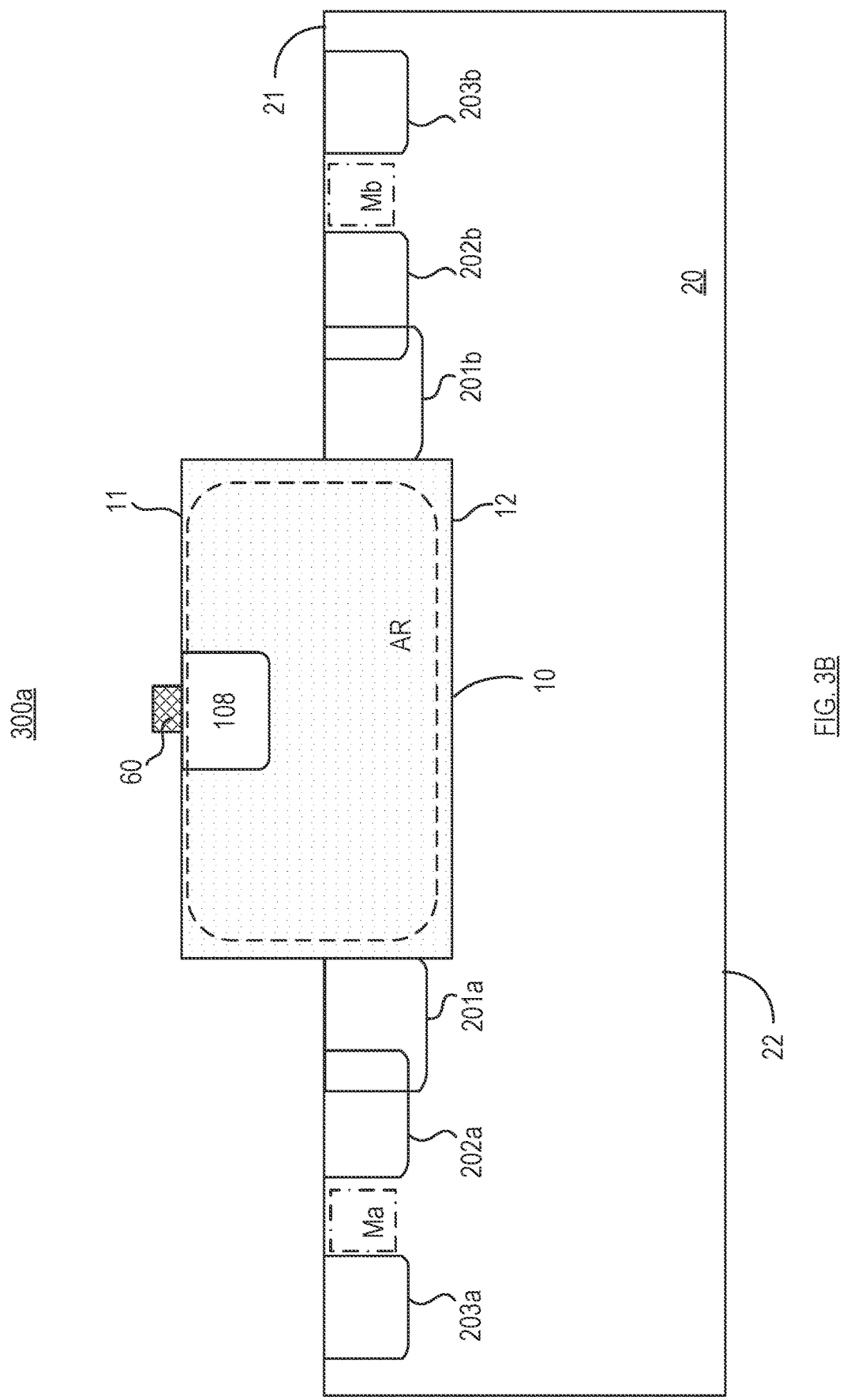
FIG. 3B illustrates a cross-sectional view along an A-A' line in FIG. 3A, according to one or more embodiments of the present disclosure.

FIG. 3A illustrates a top view of a photo-detecting apparatus 300a, according to one or more embodiments of the present disclosure. FIG. 3B illustrates a cross-sectional view along an A-A' line in FIG. 3A, according to one or more embodiments of the present disclosure. The similar reference numbers and designations indicate similar elements described before.

The photo-detecting apparatus 300a includes a substrate 20 having a first surface 21 and a second surface 22 opposite to the first surface 21, an absorption region 10 supported by the substrate 20 and configured to receive an optical signal and to generate photo-carriers in response to the optical signal. The absorption region 10 can be doped with a dopant of a first conductivity type (e.g., p-doped).

The photo-detecting apparatus 300a further includes a first contact region 108 electrically coupled to the absorption region 10 and can be doped with a dopant of the first conductivity type. The photo-detecting apparatus 300a can further include N sets of gain components 105a, 105b each including multiple second contact regions 202a, 202b each having the first conductivity type and formed in the substrate 20, and multiple third contact regions 203a, 203b each having a second conductivity type (e.g., n-doped) different from the first conductivity type and formed in the substrate 20. At least two sets of gain components 105a, 105b are disposed at two opposite sides of the absorption region 10 respectively, where the multiple second contact regions 202a, 202b are configured to be applied to a first voltage, and the multiple third contact regions 203a, 203b are configured to be applied to a second voltage.

In some embodiments, the photo-detecting apparatus 300a serves as an avalanche phototransistor. In some embodiments, the photo-detecting apparatus 300a further includes multiple multiplication regions Ma, Mb each formed between a respective second contact region 202a, 202b and a respective third contact region 203a, 203b. The multiplication region Ma, Mb are capable of generating one or more additional charge carriers in response to receiving the one or more photo-carriers generated from the absorption region 10. In some embodiments, at least two of the multiple multiplication regions Ma, Mb are formed at two opposite sides of the absorption region 10.

By having at least two sets of gain components 105a, 105b are disposed at two opposite sides of the absorption region 10 respectively, the photo-carriers generated from the absorption region 10 can be swept to one of the multiplication regions Ma, Mb, whichever is closer to the photo-carriers in the absorption region 10, and then the photo-carriers are amplified in the multiplication regions Ma, Mb. As a result, a travel distance of the photo-carriers is shortened, which increases the speed of the photo-detecting apparatus 300a.

In some embodiments, the photo-detecting apparatus 300a further includes one or more carrier-guiding regions 201a, 201b at least formed in the substrate 20 and in contact with the absorption region 10, where the one or more carrier-guiding regions 201a, 201b are each electrically coupled to a corresponding set of the N sets of gain components 105a, 105b to guide the carriers move toward the multiple multiplication regions Ma, Mb.

In some embodiments, the third contact regions 203a, 203b are configured to provide one or more electrical signals representing first collective information for deriving time-of-flight information associated with the optical signal.

Figure 4B:
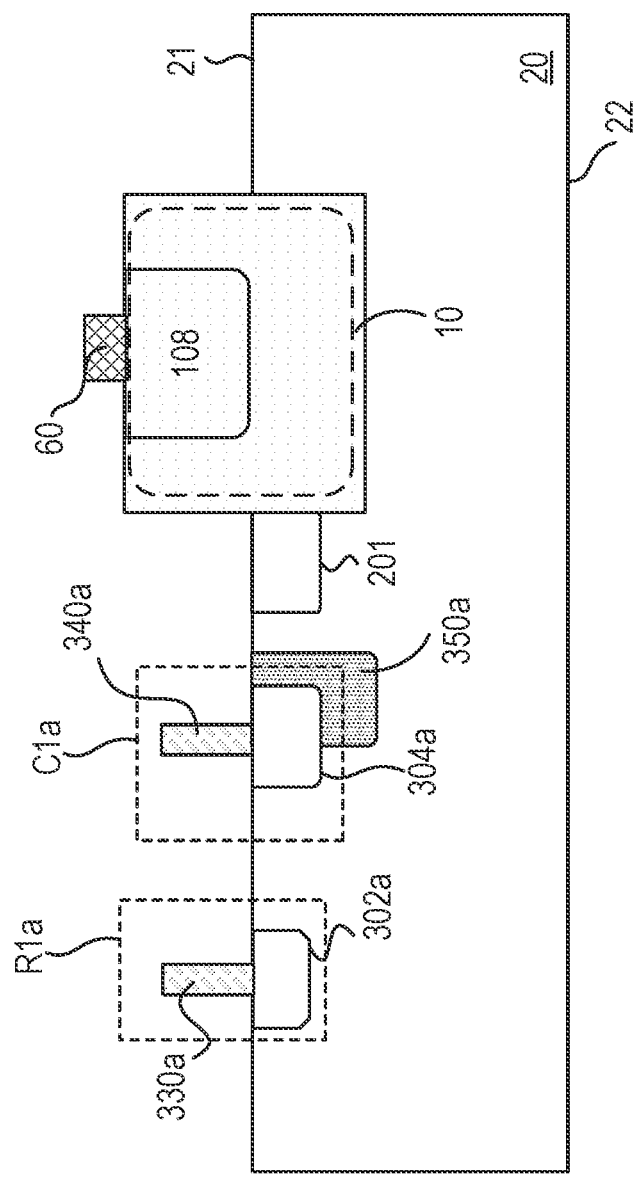
FIG. 4B illustrates a cross-sectional view along an A-A' line in FIG. 4A, according to one or more embodiments of the present disclosure.

FIG. 4A illustrates a top view of a photo-detecting apparatus 400a, according to one or more embodiments of the present disclosure. FIG. 4B illustrates a cross-sectional view along an A-A' line in FIG. 4A, according to one or more embodiments of the present disclosure. The similar reference numbers and designations indicate similar elements described before. More detailed description is described below.

As illustrated in FIGS. 4A-4B, the photo-detecting apparatus 400a includes a control region C1a having a control electrode 340a and a readout region R1a including a readout electrode 330a arranged at a side of the absorption region 10. In some embodiments, the control region C1a includes a carrier control region 304a that can have the first conductivity type (e.g., p-doped). The description of carrier control region 304a is described with more details in conjunction with FIGS. 6B and 6D. The photo-detecting apparatus 400a further includes a carrier-guiding region 201 formed at least partially in the substrate 20 and in contact with the absorption region 10.

In some embodiments, the substrate 20 can further include a counter doped region 350a at least partially overlapped with or surrounding the carrier control region 304a, and the counter doped region 350a can be of the second conductivity type (e.g., n-doped) different from the conductivity type of the substrate 20. The counter doped region 350a and the carrier-guiding region 201 can have the same conductivity type. In some examples, the absorption region 10 can be p-doped, the carrier control region 304a can be p-doped, the carrier-collection region 302a can be n-doped, the counter doped region 350a can be n-doped, and the substrate 20 can be p-doped.

In some embodiments, at least a part of the counter doped region 350a is between the carrier control region 304a and the carrier-guiding region 201. In some embodiments, the counter doped region 305a is separated from the carrier-guiding region 201. By having the carrier-guiding region 201 separated from the carrier control region 304a, the carrier-collection region 302a, and the counter doped region 350a, the photo-carriers can be driven toward the carrier control region 304a more easily. Specifically, a high resistance interface can be formed between the counter doped region 350a and the substrate 20, and the photo-carriers (e.g., electrons) travelling through the carrier-guiding region 201 can be attracted toward the counter doped region 350a and then be demodulated by the carrier control region 304a. In some embodiments, the counter doped region 350a has a peak doping concentration between $1\times10^{12}$ cm$^{-3}$ and $1\times10^{18}$ cm$^{-3}$.

Figure 4C:
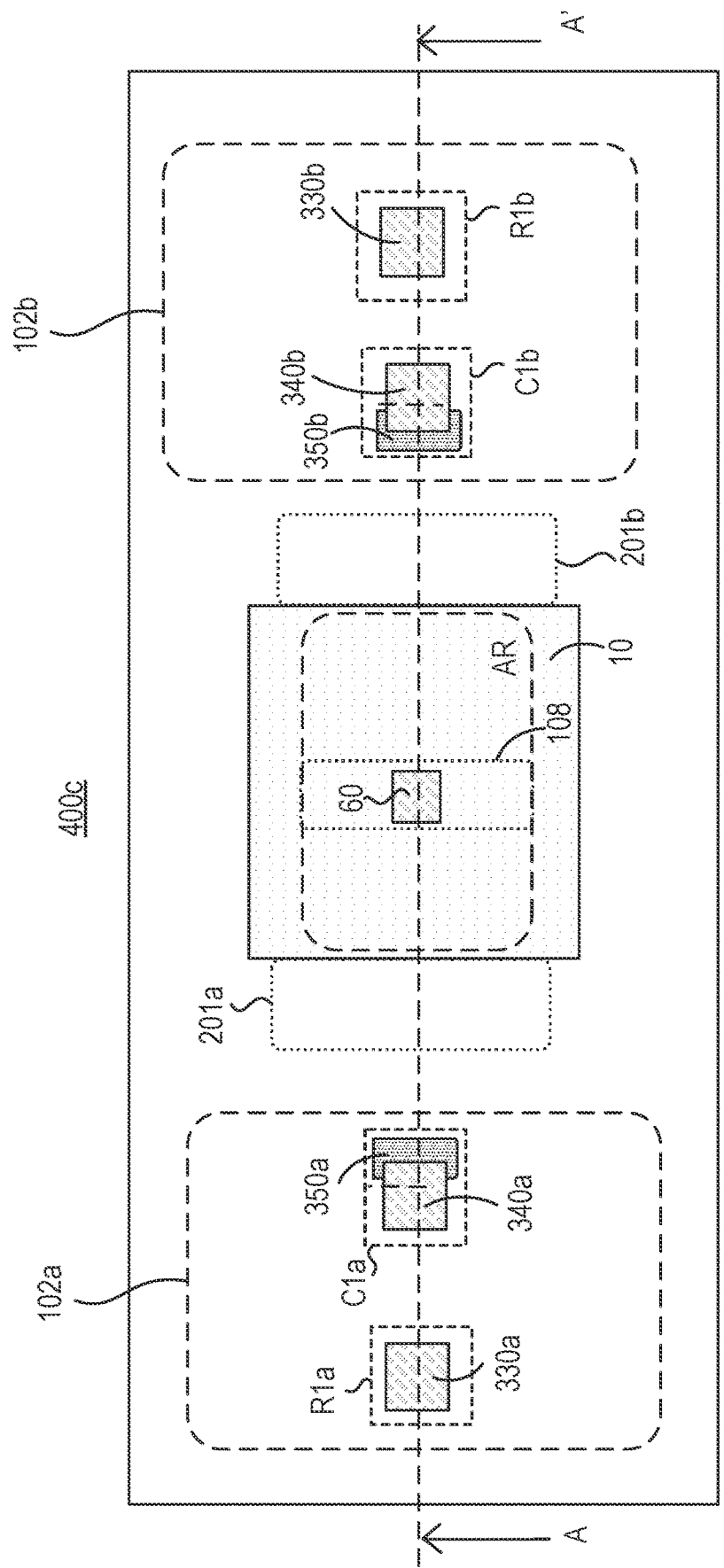
FIG. 4C illustrates a top view of a photo-detecting apparatus, according to one or more embodiments of the present disclosure.
Figure 4D:
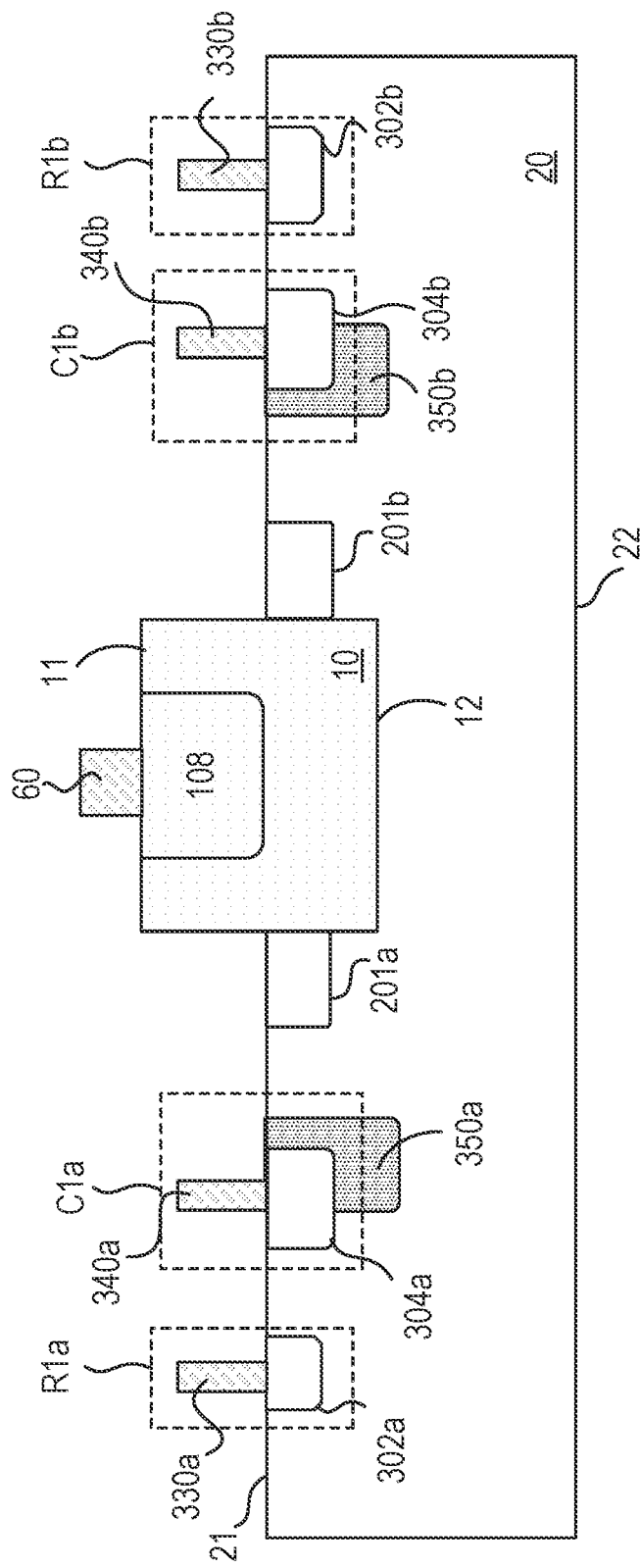
FIG. 4D illustrates a cross-sectional view along an A-A' line in FIG. 4C, according to one or more embodiments of the present disclosure.

FIG. 4C illustrates a top view of a photo-detecting apparatus 400c, according to one or more embodiments of the present disclosure. FIG. 4D illustrates a cross-sectional view along an A-A' line in FIG. 4C, according to one or more embodiments of the present disclosure. The similar reference numbers and designations indicate similar elements described before. The detailed embodiments are described below.

The photo-detecting apparatus 400c includes one or more carrier-guiding regions 201a, 201b formed at least partially in the substrate 20 and in contact with the absorption region 10. In some embodiments, the one or more carrier-guiding regions 201a, 201b are of the second conductivity type (e.g., n-doped) different from the first conductivity type of the absorption region 10.

In some embodiments, the photo-detecting apparatus 400c includes one or multiple sets of switches 102a, 102b electrically coupled to the absorption region 10, where each set of the switches includes a respective control electrode 340a, 340b and a respective readout electrode 330a, 330b over the first surface 21. Each set of the switches 102a, 102b further includes a respective carrier-collection region 302a, 302b under the respective readout electrode 330a, 330b and a respective carrier control region 304a, 304b under the respective control electrode 340a, 340b.

In some embodiments, the one or more carrier-guiding regions 201a, 201b are separated from the carrier-collection region 302a, 302b and the carrier control regions 304a, 304b. By having the carrier-guiding regions 201a, 201b separated from the carrier control regions 304a, 304b and the carrier-collection regions 302a, 302b, a stronger electric field can be formed between the respective carrier-collection regions and the substrate, which facilitates the photo-carriers to move towards the carrier control regions 304a, 304b and then be collected by the carrier-collection regions 302a, 302b.

Figure 4E:
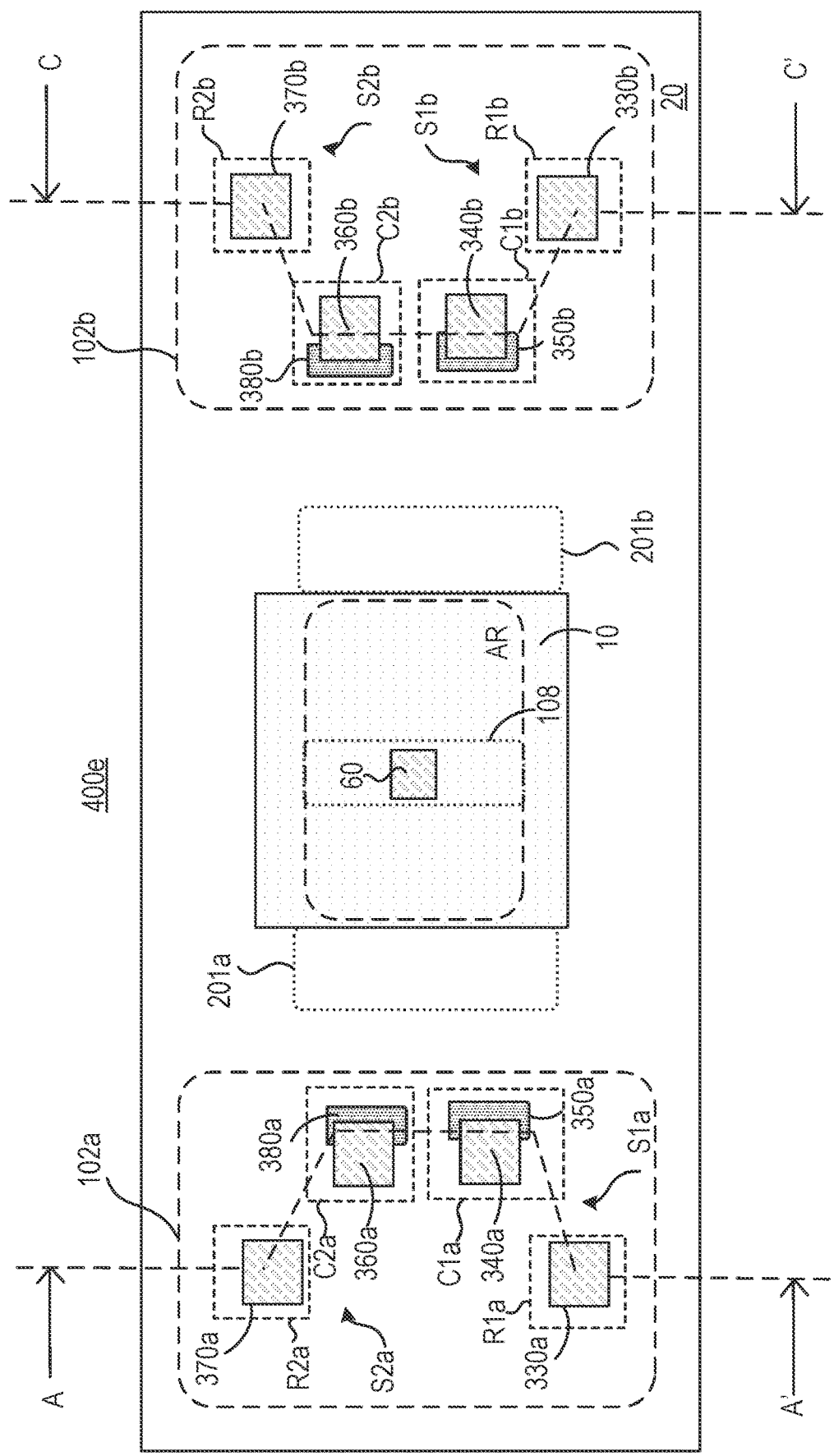
FIG. 4E illustrates a top view of a photo-detecting apparatus, according to one or more embodiments of the present disclosure.
Figure 4F:
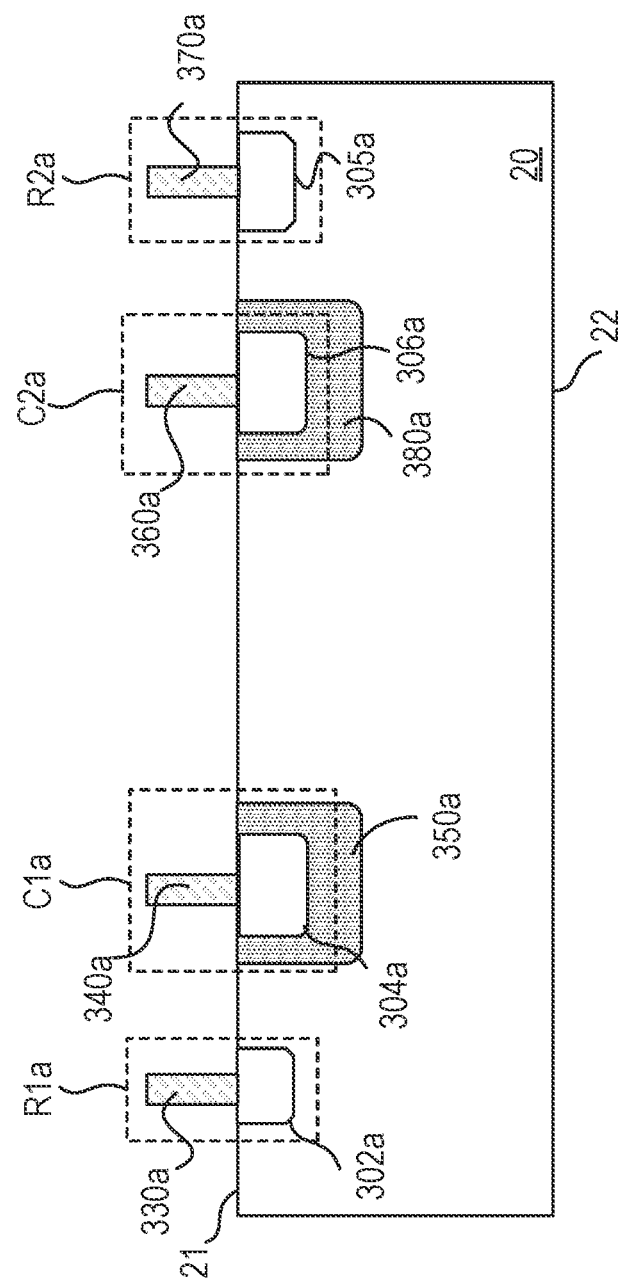
FIG. 4F illustrates a cross-sectional view along an A-A' line in FIG. 4E, according to one or more embodiments of the present disclosure.

FIG. 4E illustrates a top view of a photo-detecting apparatus 400e, according to one or more embodiments of the present disclosure. FIG. 4F illustrates a cross-sectional view along an A-A' line in FIG. 4E, according to one or more embodiments of the present disclosure. A cross-sectional view along a C-C' line in FIG. 4E can be similar to the cross-sectional views shown in FIG. 4F except that the label reference may be different. The photo-detecting apparatus 400e is similar to the photo-detecting apparatus 400c of FIGS. 4C-4D. Different from the photo-detecting apparatus 400c includes multiple sets of switches each including one switch, the photo-detecting apparatus 400e includes multiple sets of switches each including a first switch (e.g., S1a, S1b, S1c, or S1d) and a second switch (e.g., S2a, S2b, S2c, or S2d), as illustrated in FIGS. 2A-2I.

In some embodiments, a cross-sectional view along a C-C' line in FIG. 4E according to some one or more embodiments is similar to the cross-sectional view shown in FIG. 4F except that the label reference may be different. The similar reference numbers and designations indicate similar elements described before, such as FIG. 2A. In some embodiments, the photo-detecting apparatus 400e further includes In some embodiments, as illustrated in FIGS. 4E and 4F, the photo-detecting apparatus 400e includes two sets of switches 102a, 102b. The first set of switches 102a includes a first switch S1a and a second switch S2a, and the second set of switches 102b includes a first switch S1b and a second switch S2b. Each of the first switches S1a and the second switches S2a includes a respective carrier-collection region 302a, 305a under the respective readout electrode 330a, 370a and a respective carrier control region 304a, 306a under the respective control electrode 340a, 360a. Similarly, each of the first switches S1b and the second switches S2b can include a respective carrier-collection region under the respective readout electrode 330b, 370b and a respective carrier control region under the respective control electrode 340b, 360b.

The photo-detecting apparatus 400e includes one or more carrier-guiding regions 201a, 201b formed at least partially in the substrate 20 and in contact with the absorption region 10. The one or more carrier-guiding regions 201a, 201b are separated from the carrier-collection regions (e.g., 302a, 305a) and the carrier control regions (e.g., 304a, 306a). By having the carrier-guiding regions 201a, 201b separated from the carrier control regions and the carrier-collection regions, a stronger electric field can be formed between the respective carrier-collection regions and the substrate 20, which alleviates a problem of the coupling between the carrier-collection regions (e.g., 302a, 305a) of the same set of switch (e.g., 102a) at the same side of the absorption region 10.

In some embodiments, the substrate 20 further includes counter doped regions 350a, 350b, 380a, 380b each at least partially overlapped with the respective carrier control region 304a, 306a, where the counter doped regions 350a, 350b, 380a, 380b are of the second conductivity type (e.g., n-type). In some embodiments, the counter doped regions 350a, 350b, 380a, 380b are separated from the one or more carrier-guiding regions 201a, 201b. In some embodiments, the carrier control regions 304a, 306a can be entirely overlapped with the respective counter doped region 350a, 380a.

By having the carrier-guiding regions 201a, 201b separated from the carrier control regions 304a, 306a and having the carrier-collection regions 302a, 305a and the counter doped regions 350a, 350b, 380a, 380b each at least partially overlapped with the respective carrier control regions 304a, 306a, the electrons can be driven toward the carrier control regions 304a, 306a more easily. Specifically, a high resistance interface can be formed between the counter doped region 350a, 350b, 380a, 380b and the substrate 20, the carriers, for example, electrons, travelling through the carrier-guiding regions 201a, 201b can be attracted toward the counter doped region 350a, 350b, 380a, 380b and then be demodulated by the carrier control region 304a, 306a based on the control of the first control signal and the second control signal.

In some embodiments, a photo-detecting apparatus, e.g., 100a, 100c, 100d, 200a, 200d, 200e, 200g, 200h, 200i, 300, 300a, 400a 400c, or 400e, can be applied to a direct TOF system or an indirect-TOF system. In some embodiments, a photo-detecting apparatus, e.g., 100a, can be applied to a direct TOF system. For example, the readout electrodes (e.g., 330a, 330b, 370a, 370b in FIG. 1A) of the multiple switches are configured to provide one or more electrical signals representing first collective information for deriving time-of-flight information associated with the optical signal absorbed by the absorption region 10.

It should be understood that the elements mentioned in the present disclosure can be combined in any manner and in any number to create additional embodiments. For example, the absorption region 10 of the photo-detecting apparatus, 200a, 200d, 200e, 200g, 200h, 200i, 300, 300a, 400a 400c, or 400e can also be doped with a graded doping profile of the as described in FIG. 1D through FIG. 1G. For another example, the absorption region 10 of the photo-detecting apparatus, 200a, 200d, 200e, 200g, 200h, 200i, 300, 300a, 400a 400c, or 400e can also include a plurality of carrier-output regions 104a, 104b as described in FIGS. 1D and 1E, FIGS. 5A-5C illustrate cross-sectional views of portions of different photo-detecting apparatuses, according to one or more embodiments of the present disclosure. Each photo-detecting apparatus can include a structure 500a, 500b, 500c substantially the same as any embodiment described above, e.g., 100a, 100c, 100d, 200a, 200d, 200e, 200g, 200h, 200i, 300a, 400a 400c, or 400e.

Figure 5A:
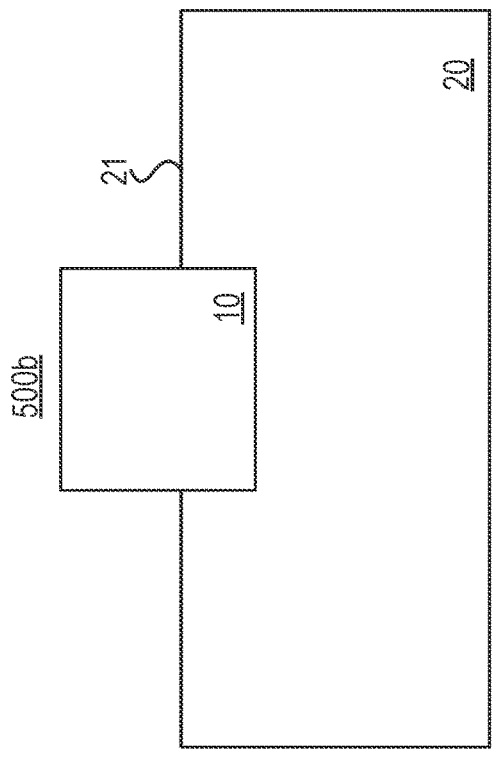
FIGS. 5A-5C illustrate cross-sectional views of a portion of a photo-detecting apparatus, according to one or more embodiments of the present disclosure.
Figure 5B:
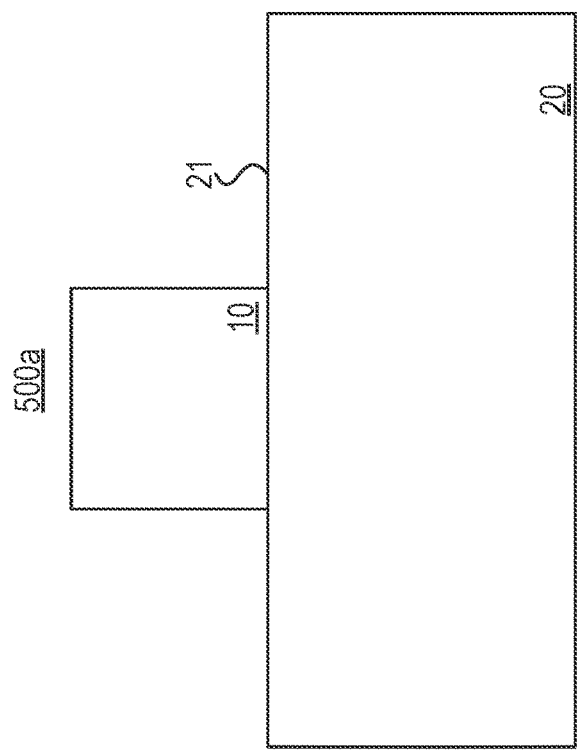
Figure 5C:
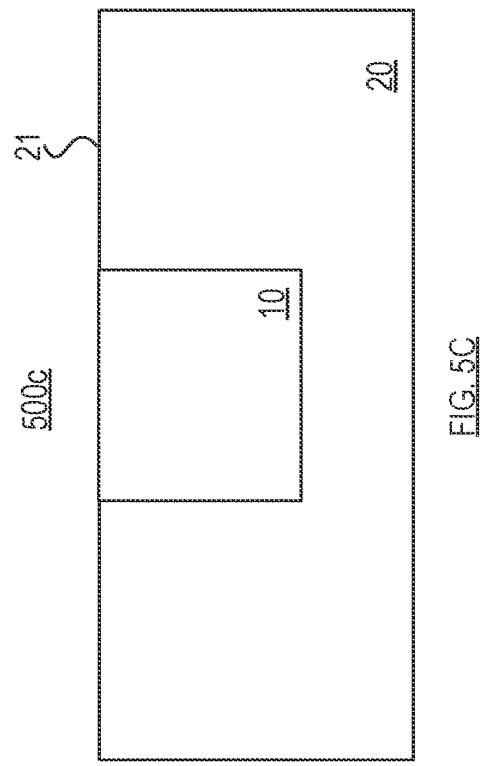

In some embodiments, as illustrated in FIG. 5A, the absorption region 10 can be entirely on the first surface 21 of the substrate 20. In some embodiments, as illustrated in FIG. 5B, the absorption region 10 can be partially embedded in the substrate 20. That is, a part of each of the side surfaces of the absorption region 10 are in contact with the substrate 20. In some embodiments, as illustrated in FIG. 5C, the absorption region 10 can be entirely embedded in the substrate 20. That is, the side surfaces of the absorption region can be entirely in contact with the substrate 20.

FIGS. 6A-6D show examples of control regions (e.g., C1a, C1b, C1c, C1d, C2a, C2b, C2c, C2d) of a photo-detecting apparatus according to one or more embodiments of the present disclosure. The photo-detecting apparatus can include a structure substantially the same as any embodiments described above, e.g., 100a, 100c, 100d, 200a, 200d, 200e, 200g, 200h, 200i, 300a, 400a 400c, or 400e.

Figure 6A:
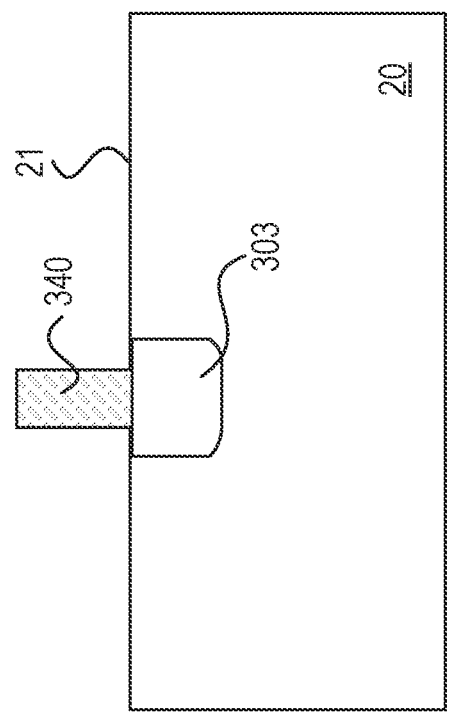
FIGS. 6A-6D show the examples of the control regions C1$a$, C1$b$, C1$c$, C1$d$, C2$a$, C2$b$, C2$c$, C2$d$ of a photo-detecting apparatus, according to one or more embodiments of the present disclosure.

In some embodiments, as illustrated in FIG. 6A, the control electrode 340 can be over the first surface 21 of the substrate 20 with an intrinsic region right under the control electrode 340. The control electrode 340 may lead to formation of a Schottky contact, an Ohmic contact, or a combination thereof having an intermediate characteristic between the two, depending on various factors including the material of the substrate 20 or the material of a passivation layer over the first surface 21 and/or the material of the control electrode 340 and/or the dopant or defect level of the substrate 20 or the passivation layer. The control electrode 340 may be any one of the control electrodes 340a, 340b, 340c, 340d, 360a, 360b, 360c, 360d.

Figure 6B:
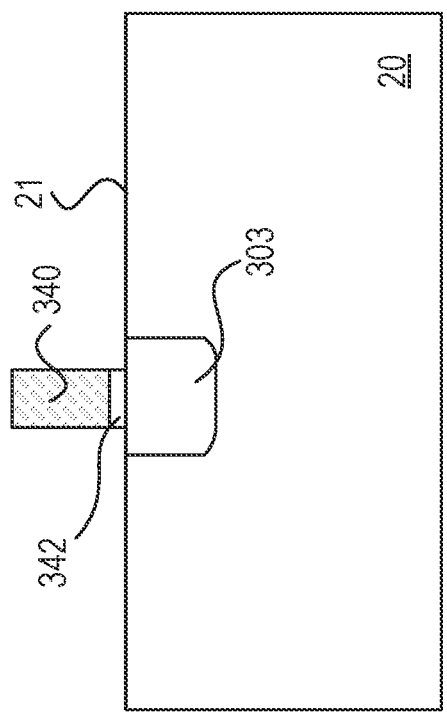

In some embodiments, as illustrated in FIG. 6B, the control region of the switch further includes a carrier control region 303 (e.g., 304a, 304b, or 306a) under the control electrodes 340 and in the substrate 20. In some embodiments, the carrier control region 303 is of a conductivity type different from the conductivity type of the carrier-collection regions 302a, 302b. In some embodiments, the carrier control region 303 includes a dopant with a dopant profile. The peak dopant concentrations of the carrier control region 303 depend on the material of the control electrode 340 and/or the material of the substrate 20 and/or the dopant or defect level of the substrate 20, for example, between $1 \times 10^{17}$ cm$^{-3}$ to $5 \times 10^{20}$ cm$^{-3}$. The carrier control region 303 can form a Schottky or an Ohmic contact or a combination thereof with the control electrode 340. The carrier control region 303 is for demodulating the carriers generated from the absorption region 10 based on the control of the control signals. The control electrode 340 may be any one of the control electrodes 340a, 340b, 340c, 340d, 360a, 360b, 360c, 360d.

Figure 6C:
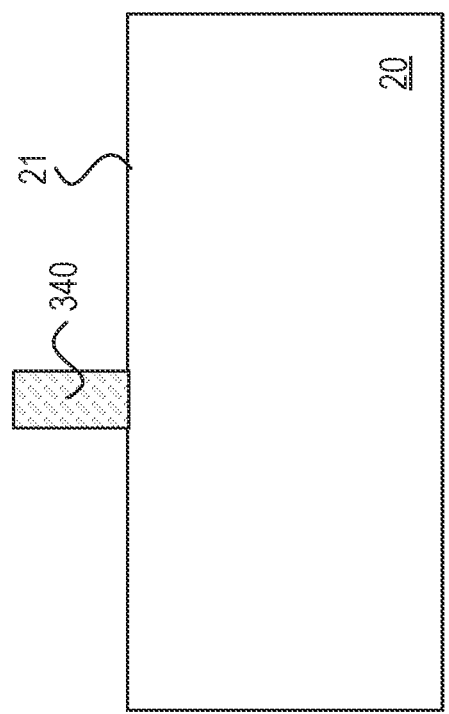

In some embodiments, as illustrated in FIG. 6C, the control region of the switch further includes a dielectric layer 342 between the substrate 20 and the control electrode 340. The dielectric layer 342 prevents direct current conduction from the control electrode 340 to the substrate 20, but allows an electric field to be established within the substrate 20 in response to an application of a voltage to the control electrode 340. The established electric field between two of the control regions, for example, between the control regions C1, C2, may attract or repel charge carriers within the substrate 20. The control electrode 340 may be any one of the control electrodes 340a, 340b, 340c, 340d, 360a, 360b, 360c, 360d.

Figure 6D:
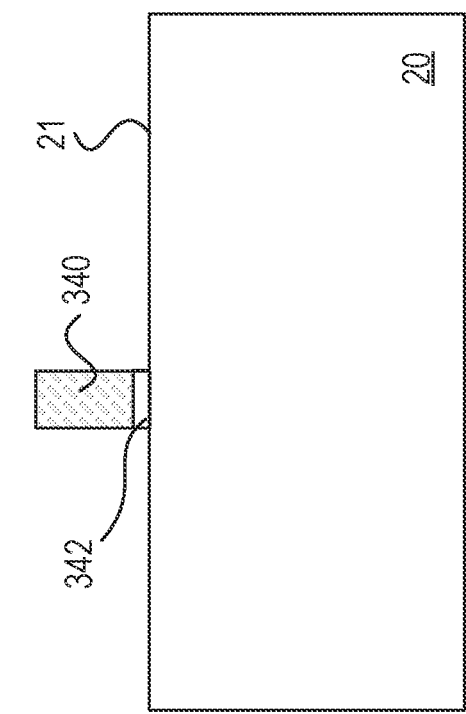

In some embodiments, as illustrated in FIG. 6D, the control region of the switch includes a carrier control region 303 under the control electrodes 340 and in the substrate 20 and a dielectric layer 342 between the substrate 20 and the control electrode 340. The control electrode 340 may be any one of the control electrodes 340a, 340b, 340c, 340d, 360a, 360b, 360c, 360d.

In some embodiments, the dielectric layer 342 may include, but is not limited to SiO$_2$. In some embodiments, the dielectric layer 342 may include a high-k material including, but not limited to, Si$_3$N$_4$, SiON, SiN$_x$, SiO$_x$, GeO$_x$, Al$_2$O$_3$, Y$_2$O$_3$, TiO$_2$, HfO$_2$ or ZrO$_2$. In some embodiments, the dielectric layer 342 may include a semiconductor material but is not limited to amorphous Si, polycrystalline Si, crystalline Si, germanium-silicon, or a combination thereof.

Figure 7A:
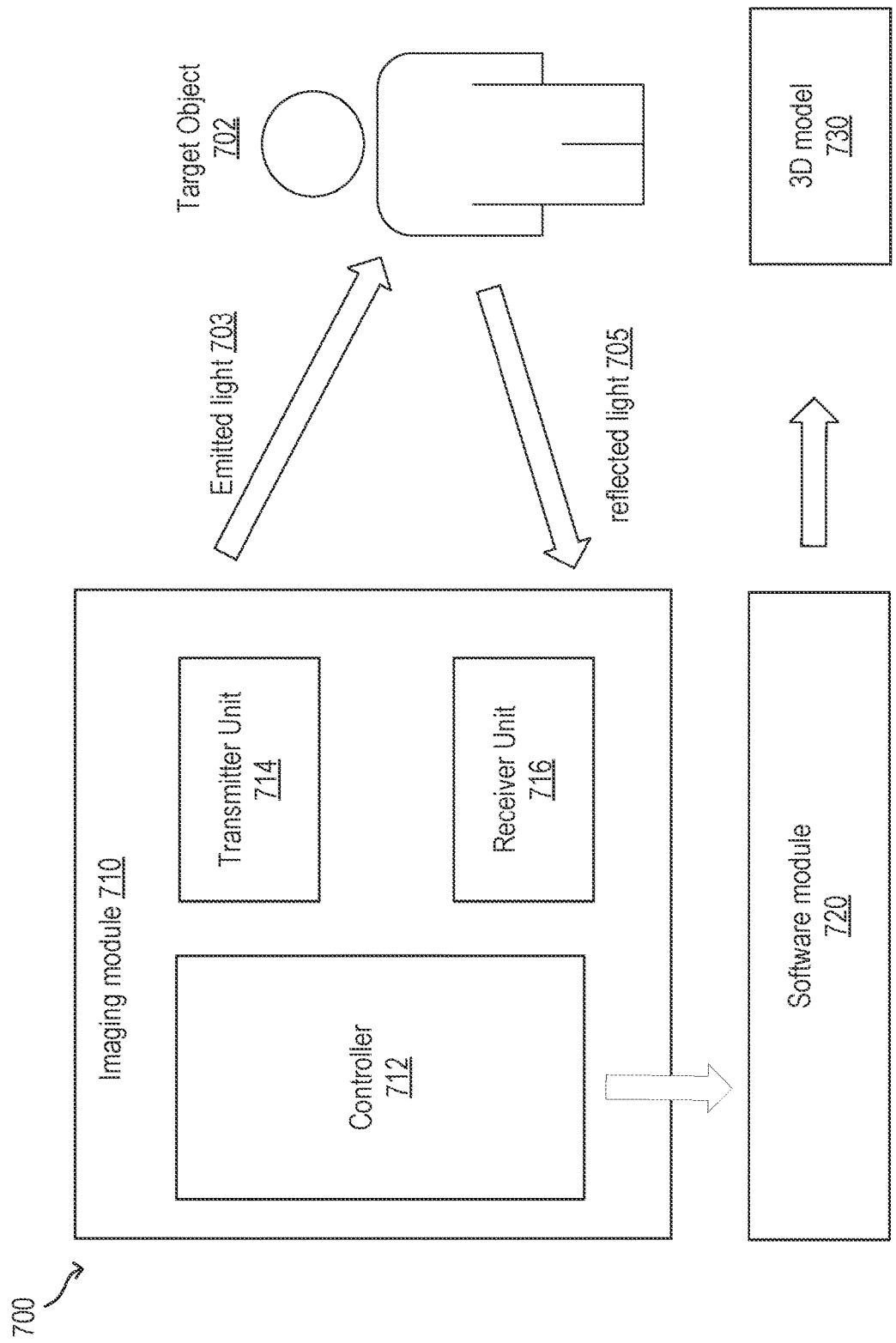
FIG. 7A is a block diagram of an example embodiment of an imaging system, according to one or more embodiments of the present disclosure.

FIG. 7A is a block diagram of an example embodiment of an imaging system 700. The imaging system 700 may include an imaging module 710 and a software module 720 configured to reconstruct a three-dimensional (3D) model 730 of a detected object. The imaging system 700 or the sensing module 710 may be implemented on a mobile device (e.g., a smartphone, a tablet, vehicle, drone, etc.), an ancillary device (e.g., a wearable device) for a mobile device, a computing system on a vehicle or in a fixed facility (e.g., a factory), a robotics system, a surveillance system, or any other suitable device and/or system.

The sensing module 710 includes a transmitter unit 714, a receiver unit 716, and a controller 712. During operation, the transmitter unit 714 may emit an emitted light 703 toward a target object 702. The receiver unit 716 may receive reflected light 705 reflected from the target object 702. The controller 612 may drive at least the transmitter unit 714 and the receiver unit 716. In some implementations, the receiver unit 716 and the controller 712 are implemented on one semiconductor chip, such as a system-on-a-chip (SoC). In some cases, the transmitter unit 714 is implemented by two different semiconductor chips, such a laser emitter chip on III-V substrate and a Si laser driver chip on Si substrate.

The transmitter unit 714 may include one or more light sources, control circuitry controlling the one or more light sources, and/or optical structures for manipulating the light emitted from the one or more light sources. In some embodiments, the light source may include one or more light emitting diodes (LEDs) or vertical-cavity surface-emitting lasers (VCSELs) emitting light that can be absorbed by the absorption region in the photo-detecting apparatus. For example, the one or more LEDs or VCSEL may emit light with a peak wavelength within a visible wavelength range (e.g., a wavelength that is visible to the human eye), such as 570 nm, 670 nm, or any other applicable wavelengths. For another example, the one or more LEDs or VCSEL may emit light with a peak wavelength above the visible wavelength range, such as 850 nm, 940 nm, 1050 nm, 1064 nm, 1310 nm, 1350 nm, 1550 nm, or any other applicable wavelengths.

In some embodiments, the emitted light from the light sources may be collimated by the one or more optical structures. For example, the optical structures may include one or more collimating lens.

The receiver unit 716 may include one or more photo-detecting apparatus according to any embodiment as mentioned above, e.g., 100a, 100c, 100d, 200a, 200d, 200e, 200g, 200h, 200i, 300a, 400c, or 400e. The receiver unit 716 may further include a control circuitry for controlling the control circuitry and/or optical structures for manipulating the light reflected from the target object toward the one or more photo-detecting apparatus. In some implementations, the optical structures include one or more lens that receive a collimated light and focus the collimated light towards the one or more photo-detecting apparatus.

In some embodiments, the controller 712 includes a timing generator (e.g., 772 in FIG. 7B) and a processing unit. The timing generator 772 receives a reference clock signal and provides timing signals to the transmitter unit 714 for modulating the emitted light 703. The timing signals are also provided to the receiver unit 716 for controlling the collection of the photo-carriers. The processing unit processes the photo-carriers generated and collected by the receiver unit 716 and determines raw data of the target object 702. The processing unit may include control circuitry, one or more signal processors 758 for processing the information output from the photo-detecting apparatus, and/ or computer storage medium that may store instructions for determining the raw data of the target object 702 or store the raw data of the target object 702. As an example, the controller 712 in an i-ToF sensor determines a distance between two points by using the phase difference between light emitted by the transmitter unit 714 and light received by the receiver unit 716.

The software module 720 may be implemented to perform in applications such as facial recognition, eye-tracking, gesture recognition, 3-dimensional model scanning/video recording, motion tracking, autonomous vehicles, and/or augmented/virtual reality.

Figure 7B:
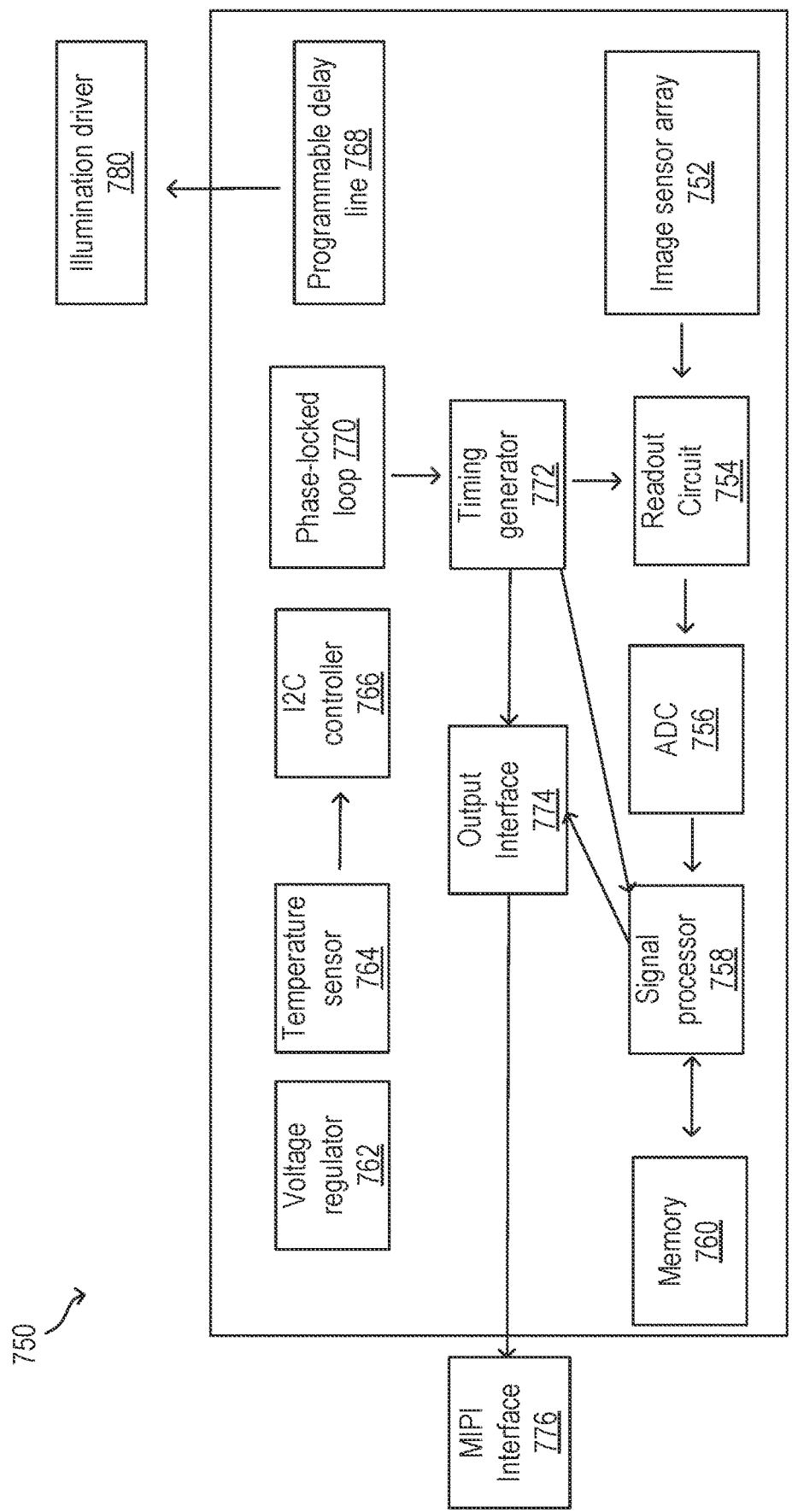
FIG. 7B shows a block diagram of an example receiver unit or a controller, according to one or more embodiments of the present disclosure.

FIG. 7B shows a block diagram of an example device 750 that can be a receiver unit (e.g., 716) or a controller (e.g., 712). Here, an image sensor array 752 (e.g., 240×180-pixel array) may be implemented using any implementations of the photo-detecting apparatus described in the present disclosure, e.g., 100a, 100c, 100d, 200a, 200d, 200e, 200g, 200h, 200i, 300a, 400c, or 400e. A phase-locked loop (PLL) circuit 770 (e.g., an integer-N PLL) may generate a clock signal (e.g., four-phase system clocks) for modulation and demodulation. Before sending to the image sensor array 752 and an external illumination driver 780, these clock signals may be gated and/or conditioned by a timing generator 772 for a preset integration time and different operation modes. A programmable delay line 768 may be added in the illumination driver 780 path to delay the clock signals.

A voltage regulator 762 may be used to control an operating voltage of the image sensor array 752. For example, N voltage domains may be used for an image sensor. A temperature sensor 764 may be implemented for the possible use of depth calibration and power control, and the integrated circuit (IC) controller 766 can access the temperature information from the temperature sensor 764.

The readout circuit 754 of the photo-detecting apparatus bridges each of the photo-detecting apparatus of the image sensor array 752 to a column analog-to-digital converter (ADC) 756, where the ADC 756 outputs may be further processed and integrated in the digital domain by a signal processor 758 before reaching an output interface 774 that is coupled to the timing generator 772. In some embodiments, the readout circuit 754 may be in a three-transistor configuration including a reset gate, a source-follower, and a selection gate, or in a four-transistor configuration including an additional transfer gate, or any suitable circuitry for processing collected charges.

A memory 760 may be used to store the outputs by the signal processor 758. In some implementations, the output interface 774 may be implemented using a 2-lane, 1.2 Gb/s D-PHY mobile industry processor interface (MIPI) transmitter, or using CMOS outputs for low-speed/low-cost systems. The digital data further conditioned by the signal processor 758 is sent out through an MIPI interface 776 for further processing.

An inter-integrated circuit (I2C) interface may be used to access all of the functional blocks described here.

In some embodiments, a bandgap of the first material of the substrate 20, is greater than a bandgap of the second material of absorption region 10. In some embodiments, the absorption region 10 includes or is composed of a semiconductor material. In some embodiments, the substrate 20 includes or is composed of a semiconductor material. In some embodiments, the absorption region 10 includes or is composed of a Group III-V semiconductor material. In some embodiments, the substrate 20 includes or is composed of a Group III-V semiconductor material. The Group III-V semiconductor material may include, but is not limited to, GaAs/AlAs, InP/InGaAs, GaSb/InAs, or InSb. For example, in some embodiments, the absorption region 10 includes or is composed of InGaAs, and the substrate 20 include or is composed of InP. In some embodiments, the absorption region 10 includes or is composed of a semiconductor material including a Group IV element. For example, Ge, Si or Sn. In some embodiments, the absorption region 10 includes or is composed of the $Si_xGe_ySn_{1-x-y}$, where $0 \le x \le 1$, $0 \le y \le 1$, $0 \le x+y \le 1$. In some embodiments, the absorption region 10 includes or is composed of $Ge_{1-a}Sn_a$, where $0 \le a \le 0.1$. In some embodiments, the absorption region 10 includes or is composed of $Ge_xSi_{1-x}$, where $0 \le x \le 1$. In some embodiments, the absorption region 10 composed of intrinsic germanium is of p-type due to material defects formed during formation of the absorption region, where the defect density is from $1 \times 10^{14}$ cm$^{-3}$ to $1 \times 10^{16}$ cm$^{-3}$. In some embodiments, the carrier-guiding region 201, 201a, 201b, 201c, 201d, includes or is composed of a semiconductor material including a Group IV element. For example, Ge, Si or Sn. In some embodiments, the substrate 20 includes or is composed of the $Si_xGe_yS_{1-x-y}$, where $0 \le x \le 1$, $0 \le y \le 1$, $0 \le x+y \le 1$. In some embodiments, the substrate 20 includes or is composed of $Ge_{1-a}Sn_a$, where $0 \le a \le 0.1$. In some embodiments, the substrate 20 includes or is composed of $Ge_xSi_{1-x}$, where $0 \le x \le 1$. For example, in some embodiments, the absorption region 10 includes or is composed of Ge, and the substrate 20 include or is composed of Si.

In some embodiments, the photo-detecting apparatus in the present disclosure further includes an optical element (not shown) over the pixel. In some embodiments, the photo-detecting apparatus in the present disclosure further includes N optical elements (not shown) over the N pixels. The optical element converges an incoming optical signal to enter the absorbed region. In some embodiments, the optical elements include lenses.

In some embodiments, p-type dopant includes a group-III element. In some embodiments, p-type dopant is boron. In some embodiments, n-type dopant includes a group-V element. In some embodiments, n-type dopant is phosphorous.

In the present disclosure, if not specifically mentioned, the absorption region is configured to absorb photons having a peak wavelength in an invisible wavelength range equal to or greater than 800 nm, such as 850 nm, 940 nm, 1050 nm, 1064 nm, 1310 nm, 1350 nm, or 1550 nm or any suitable wavelength range. In some embodiments, the absorption region receives an optical signal and converts the optical signal into electrical signals. The absorption region can be in any suitable shape, such as, but not limited to, cylinder, or rectangular prism.

In the present disclosure, if not specifically mentioned, the absorption region has a thickness depending on the wavelength of photons to be detected and the material of the absorption region. In some embodiments, when the absorption region includes germanium and is designed to absorb photons having a wavelength equal to or greater than 800 nm, the absorption region has a thickness equal to or greater than 0.1 µm. In some embodiments, the absorption region includes germanium and is designed to absorb photons having a wavelength between 800 nm and 2000 nm, the absorption region has a thickness between 0.1 µm and 2.5 µm. In some embodiments, the absorption region has a thickness between 1 µm and 2.5 µm for a higher quantum efficiency. In some embodiments, the absorption region may be grown using a blanket epitaxy, a selective epitaxy, or other applicable techniques.

In the present disclosure, if not specifically mentioned, the light shield has the optical window for defining the position of the optical signal receiving region in the absorption region. In other words, the optical window is for allowing the incident optical signal enter into the absorption region and defining the optical signal receiving region. In some embodiments, the light shield is on a second surface of the substrate distant from the absorption region when an incident light enters the absorption region from the second surface of the substrate. In some embodiments, a shape of the optical window can be ellipse, circle, rectangular, square, rhombus, octagon, or any other suitable shape from a top view of the optical window.

In the present disclosure, if not specifically mentioned, in a same pixel, the type of the photo-carriers collected by the carrier-collection region of one of the switches and the type of the photo-carriers collected by the carrier-collection region of the other switch are the same. For example, when the photo-detecting apparatus is configured to collects electrons, when the first switch is switched on and the second switch is switched off, the carrier-collection region in the first switch collects electrons of the photo-carriers generated from the absorption region, and when the second switch is switched on and the first switch is switched off, the carrier-collection region in the second switch also collects electrons of the photo-carriers generated from the absorption region.

In the present disclosure, if not specifically mentioned, the term "electrode", includes metals or alloys. For example, the first electrode, second electrode, readout electrode, and the control electrode include Al, Cu, W, Ti, Ta—TaN—Cu stack, or Ti—TiN—W stack.

In some embodiments, if not specifically mentioned, the cross-sectional views shown in the present disclosure may be a cross-sectional view along any possible cross-sectional line of a photo-detecting apparatus.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photo-detecting apparatus, comprising:
a substrate comprising a first material;
an absorption region comprising a second material, wherein the absorption region is supported by the substrate, and wherein the absorption region is configured to receive an optical signal and to generate photo-carriers in response to the optical signal; and
multiple sets of a switch including a first set and a second set,
wherein the absorption region is arranged in between the first set and the second set,
wherein the first set comprises: a first control region and a second control region, and a first readout region and a second readout region,
wherein the second set comprises: a third control region and a fourth control region, and a third readout region and a fourth readout region,
wherein the first control region and the third control region are coupled to a first control signal, and wherein the second control region and the fourth control region are coupled to a second control signal,
wherein the first readout region and the third readout region are coupled to a first readout circuitry, and wherein the second readout region and the fourth readout region are coupled to a second readout circuitry,
wherein the multiple sets of the switch further comprise a third set and a fourth set, and wherein the absorption region is arranged in between the third set and the fourth set,
wherein the third set comprises a fifth control region and a sixth control region and a fifth readout region and a sixth readout region, and wherein the fourth set comprises a seventh control region and an eighth control region and a seventh readout region and an eighth readout region,
wherein the fifth control region and the seventh control region are coupled to the first control signal, and wherein the sixth control region and the eighth control region are coupled to the second control signal, and
wherein the fifth readout region and the seventh readout region are coupled to the first readout circuitry, and wherein the sixth readout region and the eighth readout region are coupled to the second readout circuitry.

2. The photo-detecting apparatus of claim 1, further comprising one or more carrier-guiding regions formed at least partially in the substrate and in contact with the absorption region,
wherein each of the one or more carrier-guiding regions is electrically coupled to a respective set of the multiple sets of the switch.

3. The photo-detecting apparatus of claim 2, wherein each of the one or more carrier-guiding regions is n-doped.

4. The photo-detecting apparatus of claim 2, wherein the absorption region further comprises a plurality of carrier-output regions each in contact with a respective carrier-guiding region of the one or more carrier-guiding regions.

5. The photo-detecting apparatus of claim 2, wherein:
the absorption region is of a first conductivity type,
the one or more carrier-guiding regions are of a second conductivity type different from the first conductivity type,
the substrate is of the first conductivity type,
each of control regions of the multiple sets comprises a carrier control region of the first conductivity type,
each of readout regions of the multiple sets comprises a carrier-collection region of the second conductivity type, and
the one or more carrier-guiding regions are separated from carrier control regions of the control regions and carrier-collection regions of the readout regions.

6. The photo-detecting apparatus of claim 5, wherein the substrate further comprises a counter doped region at least partially overlapped with one of the carrier control regions, and
wherein the counter doped region is of the second conductivity type.

7. The photo-detecting apparatus of claim 1, wherein the absorption region is doped with a graded doping profile.

8. The photo-detecting apparatus of claim 7, wherein the absorption region comprises a first surface and a second surface between the first surface of the absorption region and a surface of the substrate, and
wherein the graded doping profile of the absorption region is gradually decreased along a direction from the second surface of the absorption region to the first surface of the absorption region.

9. The photo-detecting apparatus of claim 1, wherein the absorption region is at least partially embedded in the substrate.

10. A photo-detecting apparatus, comprising:
a substrate comprising a first material;
an absorption region comprising a second material, wherein the absorption region is supported by the substrate, and wherein the absorption region is configured to receive an optical signal and to generate photo-carriers in response to the optical signal;
a control unit configured to provide at least one control signal;
a first readout circuitry and a second readout circuitry; and
multiple sets of a switch including a first set and a second set,
wherein the absorption region is arranged in between the first set and the second set,
wherein the first set comprises a first control region and a second control region, and a first readout region and a second readout region,
wherein the second set comprises a third control region and a fourth control region, and third readout region and a fourth readout region,
wherein the first control region and the third control region are coupled to the control unit to receive a first control signal, and wherein the second control region and the fourth control region are coupled to the control unit to receive a second control signal,
wherein the first readout region and the third readout region are coupled to the first readout circuitry, and wherein the second readout region and the fourth readout region are coupled to a second readout circuitry,
wherein the multiple sets of the switch further comprise a third set and a fourth set, and wherein the absorption region is arranged in between the third set and the fourth set,
wherein the third set comprises a fifth control region and a sixth control region and a fifth readout region and a sixth readout region, and wherein the fourth set comprises a seventh control region and an eighth control region and a seventh readout region and an eighth readout region,
wherein the fifth control region and the seventh control region are coupled to the control unit to receive the first control signal, and wherein the sixth control region and the eighth control region are coupled to the control unit to receive the second control signal, and
wherein the fifth readout region and the seventh readout region are coupled to the first readout circuitry, and wherein the sixth readout region and the eighth readout region are coupled to the second readout circuitry.

11. The photo-detecting apparatus of claim 10, further comprising one or more carrier-guiding regions formed at least partially in the substrate and in contact with the absorption region,
wherein each of the one or more carrier-guiding regions is electrically coupled to a respective set of the multiple sets of the switch.

12. The photo-detecting apparatus of claim 11, wherein the absorption region further comprises a plurality of carrier-output regions each in contact with a respective carrier-guiding region of the one or more carrier-guiding regions.

13. The photo-detecting apparatus of claim 11, wherein each of control regions of the multiple sets comprises a carrier control region of a first conductivity type,
wherein the substrate further comprises a counter doped region at least partially overlapped with one of carrier control regions of the control regions, and
wherein the counter doped region is of a second conductivity type.

14. The photo-detecting apparatus of claim 10, wherein the absorption region is doped with a graded doping profile.

15. The photo-detecting apparatus of claim 14, wherein the absorption region comprises a first surface and a second surface between the first surface of the absorption region and a surface of the substrate, and
wherein the graded doping profile of the absorption region is gradually decreased along a direction from the second surface of the absorption region to the first surface of the absorption region.

16. The photo-detecting apparatus of claim 10, wherein the absorption region is at least partially embedded in the substrate.

* * * * *